United States Patent
Iwaki et al.

(10) Patent No.: US 10,355,668 B2
(45) Date of Patent: Jul. 16, 2019

(54) ACOUSTIC WAVE DEVICE

(71) Applicant: TAIYO YUDEN CO., LTD., Tokyo (JP)

(72) Inventors: Masafumi Iwaki, Tokyo (JP); Yoshio Sato, Tokyo (JP); Tabito Tanaka, Tokyo (JP); Hidetaro Nakazawa, Tokyo (JP); Takashi Matsuda, Tokyo (JP); Jun Tsutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 187 days.

(21) Appl. No.: 14/970,153

(22) Filed: Dec. 15, 2015

(65) Prior Publication Data
US 2016/0211829 A1   Jul. 21, 2016

(30) Foreign Application Priority Data

Jan. 20, 2015 (JP) .................................. 2015-008909
Jun. 25, 2015 (JP) .................................. 2015-127715

(51) Int. Cl.
H03H 9/02 (2006.01)
H03H 9/13 (2006.01)
(Continued)

(52) U.S. Cl.
CPC ........ H03H 9/725 (2013.01); H03H 9/02559 (2013.01); H03H 9/1457 (2013.01);
(Continued)

(58) Field of Classification Search
CPC ........... H03H 9/02559; H03H 9/02669; H03H 9/02834; H03H 9/02866; H03H 9/131;
(Continued)

(56) References Cited

U.S. PATENT DOCUMENTS 6,366,002 B1   4/2002  Kadota
6,861,927 B1 * 3/2005  Abbott ............... H03H 9/14555
                                                      310/313 B
(Continued)

FOREIGN PATENT DOCUMENTS

CN   102714490 A   10/2012
CN   102916673 A   2/2013
(Continued)

OTHER PUBLICATIONS

English language machine translation of JP 2008-136238 A, published Jun. 12, 2008, 8 pages.*
(Continued)

*Primary Examiner* — Barbara Summons
(74) *Attorney, Agent, or Firm* — Chen Yoshimura LLP

(57) ABSTRACT

An acoustic wave device includes: a Y-cut X-propagation lithium tantalate substrate having a cut angle of 20° or more and 48° or less; and a grating electrode that is composed of one or more metal films laminated on the substrate, and excites an acoustic wave, wherein when a density of each metal film in the one or more metal films is represented by $\rho i$, a Poisson's ratio of each metal film is represented by Pi, a film thickness of each metal film is represented by hi, a density of Cu is represented by $\rho 0$, a Poisson's ratio of Cu is represented by P0 and a pitch is represented by $\lambda$, a total value of "$(hi/\lambda) \times (\rho i/\rho 0) \times (Pi/P0)$" for each metal film with respect to the one or more metal films is more than 0.08.

13 Claims, 24 Drawing Sheets

(51) Int. Cl.
  *H03H 9/64* (2006.01)
  *H03H 9/72* (2006.01)
  *H03H 9/145* (2006.01)

(52) U.S. Cl.
  CPC .......... *H03H 9/14541* (2013.01); *H03H 9/64* (2013.01); *H03H 9/02669* (2013.01); *H03H 9/131* (2013.01)

(58) Field of Classification Search
  CPC .... H03H 9/14541; H03H 9/1457; H03H 9/64; H03H 9/725
  USPC ................................ 333/133, 193, 195, 196
  See application file for complete search history.

(56) References Cited

U.S. PATENT DOCUMENTS

| | | | |
|---|---|---|---|
| 7,208,860 B2 * | 4/2007 | Kadota | H03H 9/02559 310/313 A |
| RE39,975 E | 1/2008 | Kadota | |
| 7,459,991 B2 * | 12/2008 | Ruile | H03H 9/02834 310/313 A |
| 7,576,471 B1 * | 8/2009 | Solal | H03H 9/02858 310/313 B |
| 7,939,989 B2 * | 5/2011 | Solal | H03H 9/02858 310/313 B |
| 7,994,878 B2 * | 8/2011 | Isobe | H03H 9/0222 333/154 |
| 2001/0048386 A1 | 12/2001 | Edmonson et al. | |
| 2006/0103486 A1 | 5/2006 | Ruile et al. | |
| 2008/0074212 A1 * | 3/2008 | Matsuda | H03H 9/02559 333/195 |
| 2011/0068655 A1 | 3/2011 | Solal et al. | |
| 2011/0204998 A1 * | 8/2011 | Seo | H03H 9/02818 333/193 |
| 2012/0049690 A1 | 3/2012 | Okamoto et al. | |
| 2013/0026881 A1 * | 1/2013 | Okamoto | H03H 9/0222 310/313 C |
| 2013/0033151 A1 | 2/2013 | Ueda et al. | |
| 2013/0051588 A1 * | 2/2013 | Ruile | H03H 3/08 381/190 |
| 2013/0249647 A1 | 9/2013 | Nakanishi et al. | |
| 2014/0001919 A1 | 1/2014 | Komatsu et al. | |
| 2015/0243873 A1 | 8/2015 | Nakanishi et al. | |

FOREIGN PATENT DOCUMENTS

| | | | |
|---|---|---|---|
| JP | 10-247835 A | | 9/1998 |
| JP | 2001-77662 A | | 3/2001 |
| JP | 2004-228901 A | * | 8/2004 |
| JP | 2006-513649 A | | 4/2006 |
| JP | 2008-136238 A | * | 6/2008 |
| JP | 2011-101350 A | | 5/2011 |
| JP | 2012-070361 A | | 4/2012 |
| JP | 2013-518455 A | | 5/2013 |
| JP | 2013-544041 A | | 12/2013 |
| WO | 2012/127793 A1 | | 9/2012 |

OTHER PUBLICATIONS

English language machine translation of JP 2001-077662 A, published Mar. 23, 2001, 7 pages.*
Website Table "Density of the elements" at web address http://periodictable.com/Properties/A/Density.al.html, Density for all the elements in the Periodic Table listed alphabetically, printed Jun. 20, 2017, 2 pages.*
Website Table "Poisson Ratio of the elements" at web address http://periodictable.com/Properties/A/PoissonRatio.al.html, Poisson Ratio for all the elements in the Periodic Table listed alphabetically, printed Jun. 20, 2017, 1 page.*
Chinese Office Action dated Nov. 23, 2017, in a counterpart Chinese patent application No. 201610037045.5.
Japanese Office Action dated Feb. 13, 2018, in a counterpart Japanese patent application No. 2015-127715. (A machine translation (not reviewed for accuracy) attached.).
Chinese Office Action dated Jun. 15, 2018, in a counterpart Chinese patent application No. 201610037045.5.
Japanese Office Action dated Sep. 18, 2018, in a counterpart Japanese patent application No. 2015-127715. (A machine translation (not reviewed for accuracy) attached.).

* cited by examiner

——— FIRST VARIATION EXAMPLE OF FOURTH EMBODIMENT
-------- COMPARATIVE EXAMPLE

——— FIRST VARIATION EXAMPLE OF FOURTH EMBODIMENT
-------- COMPARATIVE EXAMPLE

ACOUSTIC WAVE DEVICE

CROSS-REFERENCE TO RELATED APPLICATION

This application is based upon and claims the benefit of priority of the prior Japanese Patent Applications No. 2015-008909, filed on Jan. 20, 2015, and No. 2015-127715, filed on Jun. 25, 2015, the entire contents of which are incorporated herein by reference.

FIELD

A certain aspect of the present invention relates to an acoustic wave device, e.g. to an acoustic wave device having a grating electrode formed on a piezoelectric substrate.

BACKGROUND

In a high frequency communication system representing a cell-phone, a high frequency filter or the like is used to remove undesired signals which are not included in a frequency band to be used for communication. An acoustic wave device having a surface acoustic wave (SAW) element is used for the high frequency filter or the like. The SAW element is an element in which the grating electrode such as an IDT (Interdigital Transducer) is formed on the piezoelectric substrate. There is an element using a SH (Shear Horizontal) wave which is a kind of the surface acoustic wave, as the SAW element.

The SH wave is the surface acoustic wave applying a stress to shear the piezoelectric substrate in a direction which is parallel to a surface of the piezoelectric substrate and orthogonal to a propagation direction of the SH wave. An acoustic velocity of the SH wave is fast, compared with a bulk wave propagating in a solid of the piezoelectric substrate. For this reason, the SH wave propagates on the surface of the piezoelectric substrate while emitting the bulk wave into the piezoelectric substrate. Therefore, in the acoustic wave device using the SH wave, the reduction of a loss has a limit.

For the reduction of the loss of the acoustic wave device using the SH wave, the acoustic velocity of the SH wave is reduced by attaching a slow acoustic velocity material on the piezoelectric substrate. The acoustic velocity of the SH wave is made slower than the bulk wave propagating in the piezoelectric substrate (e.g. a slowest lateral wave of the bulk wave). Thereby, the emission of the bulk wave at the time of the propagation of the SH wave is reduced, and the acoustic wave device using the SH wave can reduce the loss. Thus, the device which reduced the loss is commonly called "love wave type SAW device".

Patent Document 1 (Japanese Laid-open Patent Publication No. 10-247835) discloses that an Au electrode is formed on a rotated Y-cut X-propagation lithium tantalate (LiTaO$_3$) substrate having a cut angle of 0°, and when "h/λ" changes from 0.04 to 0.08 on the assumption that a pitch of the electrode is "λ" and a film thickness is "h", the loss is reduced. The Patent Document 1 discloses that, by changing the "h/λ" from 0.04 to 0.08, the acoustic velocity of the SH wave (a leaky wave) is made slower than the acoustic velocity of the slowest lateral wave, and hence the loss is reduced.

Patent Document 2 (Japanese Laid-open Patent Publication No. 2001-77662) discloses that an Au electrode is formed on a rotated Y-cut X-propagation lithium tantalate substrate having a cut angle of 36°, and when the "h/λ" changes from 0 to 0.05, the loss is reduced.

Moreover, in the acoustic wave device having the IDT, there is known a technique that reduces undesired lateral-mode waves. Patent Document 3 (Japanese Laid-open Patent Publication No. 2011-101350) discloses that the undesired lateral-mode waves are reduced by widening the widths of electrode fingers of edge regions with respect to a central region in an overlap region of the IDT. Patent Document 4 (Japanese National Publication of International Patent Application No. 2013-544041) discloses that the undesired lateral-mode waves are reduced by adding dielectric films to electrode fingers of edge regions.

The calculation in the Patent Documents 1 and 2 supposes that the electrodes are uniformly formed on the piezoelectric substrate. That is, each of the electrodes is not the grating electrode. For example, in the Patent Document 2, an electromechanical coupling coefficient and a propagation loss in a case where the "h/λ" changes from 0 to 0.1 are calculated. However, in the calculation, the grating electrode is not used as the electrode. Thus, the range of the "h/λ" in the Patent Documents 1 and 2 does not prescribe a range reducing the loss.

SUMMARY OF THE INVENTION

According to an aspect of the present invention, there is provided an acoustic wave device including: a Y-cut X-propagation lithium tantalate substrate having a cut angle of 20° or more and 48° or less; and a grating electrode that is composed of one or more metal films laminated on the substrate, and excites an acoustic wave, wherein when a density of each metal film in the one or more metal films is represented by ρi, a Poisson's ratio of each metal film is represented by Pi, a film thickness of each metal film is represented by hi, a density of Cu is represented by ρ0, a Poisson's ratio of Cu is represented by P0 and a pitch is represented by λ, a total value of "(hi/λ)×(ρi/ρ0)×(Pi/P0)" for each metal film with respect to the one or more metal films is more than 0.08.

DETAILED DESCRIPTION

Hereinafter, a description will be given of a present invention with reference to drawings.

First Embodiment

A case where a grating electrode formed on a piezoelectric substrate excites a SH wave was simulated. It is considered that, when the acoustic velocity of the SH wave becomes smaller than that of a lateral wave of the bulk wave by using a slow acoustic velocity material as the grating electrode, the emission of the bulk wave does not occur and the loss is reduced. Therefore, an inventor focused on Cu (copper), W (tungsten), Ru (ruthenium) and Mo (molybdenum) as a material in which the acoustic velocity is slow, and which is heavy and can be deposited on the piezoelectric substrate. When each of metal films of these metals is used for the grating electrode, a relationship between a film thickness of each of the metals films and a loss of an acoustic wave resonator was simulated using a finite element method.

Figure 1A:
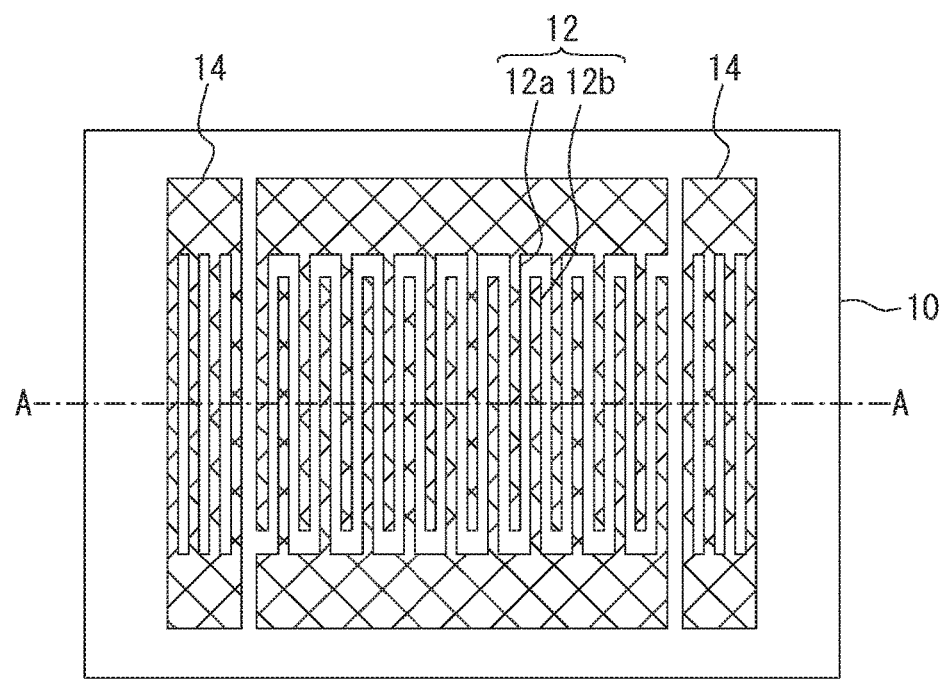
FIG. 1A is a plane view of a resonator used for simulation.
Figure 1B:
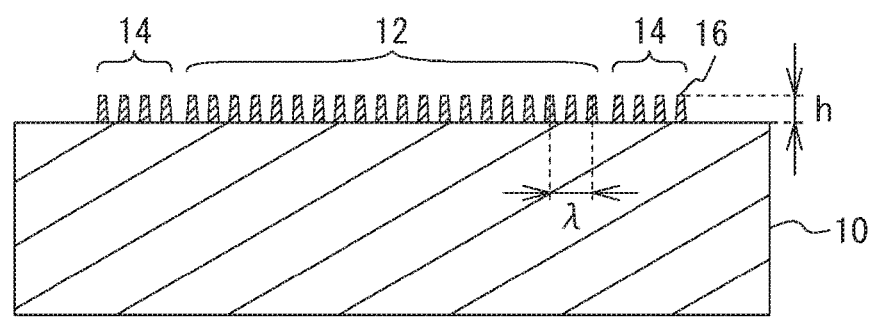
FIG. 1B is a cross-section view taken along a line A-A of FIG. 1A.
Figure 2A:
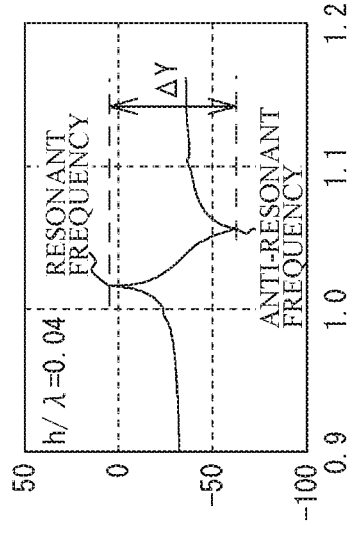
FIGS. 2A to 2D are views illustrating results that simulated an admittance with respect to a standardized frequency in the resonator.
Figure 2B:
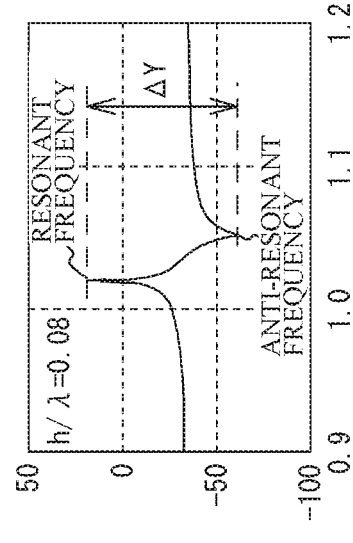
Figure 2C:
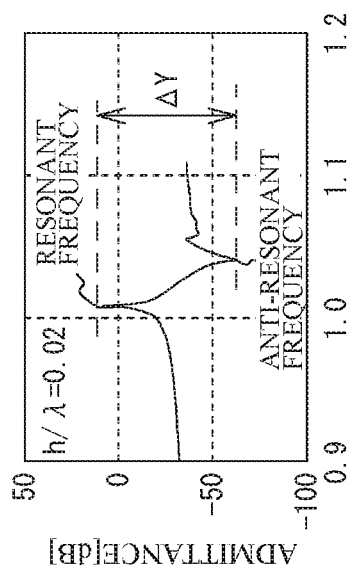
Figure 2D:
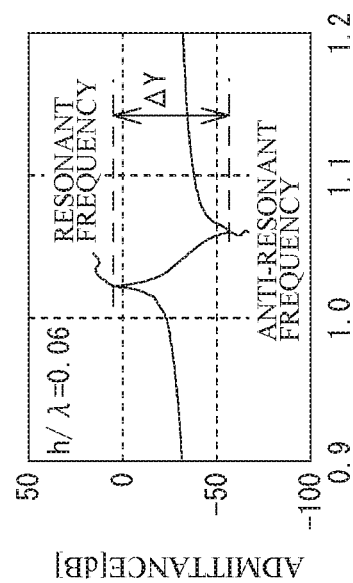
Figure 3A:
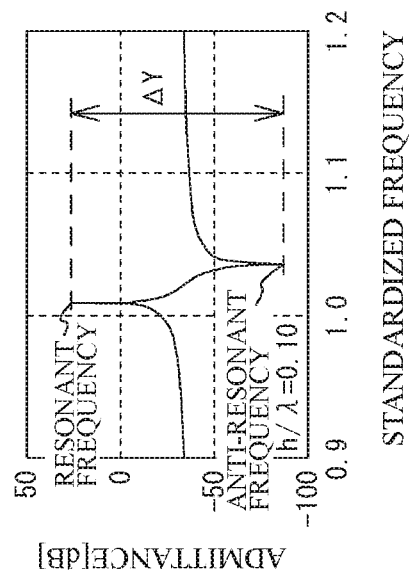
FIGS. 3A to 3C are views illustrating results that simulated an admittance with respect to a standardized frequency in the resonator.
Figure 3B:
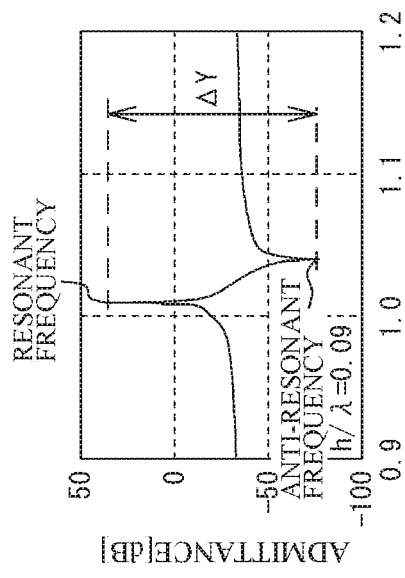
Figure 3C:
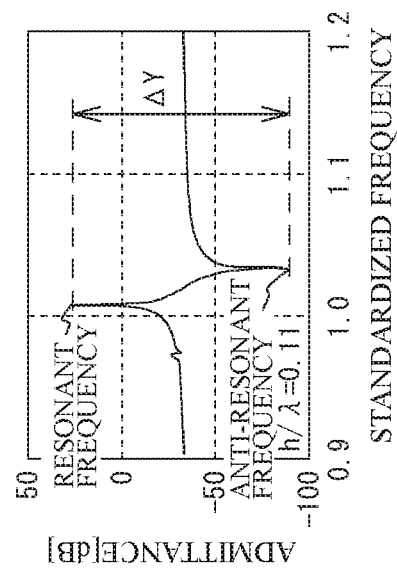

FIG. 1A is a plane view of a resonator used for simulation. FIG. 1B is a cross-section view taken along a line A-A of FIG. 1A. As illustrated in FIGS. 1A and 1B, an IDT 12 and reflectors 14 are formed on a piezoelectric substrate 10. The piezoelectric substrate 10 is a rotated Y-cut X-propagation lithium tantalate substrate. The IDT 12 and the reflectors 14 are made of a metal film 16. The IDT 12 includes a pair of interdigital electrodes 12a and 12b. Each of the pair of interdigital electrodes 12a and 12b includes a plurality of electrode fingers and a bus bar to which the plurality of electrode fingers are connected. Each of the plurality of electrode fingers included in the pair of interdigital electrodes 12a and 12b forms a grating electrode. The reflectors 14 are formed at the both sides of the IDT 12 in a propagation direction of an acoustic wave. The reflectors 14 reflect the acoustic wave. The film thickness of the metal film 16 is represented by h and a pitch between the grating electrodes (i.e., electrode fingers of the IDT 12 extending from the same bus bar) is represented by λ. The λ corresponds to a wavelength of a SH (Shear Horizontal) wave which the IDT 12 excites.

The structure of the simulated resonator is represented below.

Pitch λ: 4 μm
Duty ratio of the electrode fingers: 50%
Number of pairs of the electrode finger in the IDT: 55.5 pairs
Number of electrode fingers in the reflector: 20
Opening length: 35λ

A table 1 represents physical property values of the metals used for the simulation as materials of the metal film 16. As illustrated in the table 1, a Cu film, a W film, a Ru film and a Mo metal are used as the metal film. A density, a Young's modulus, and a Poisson's ratio are used as the physical property values.

TABLE 1

|  | Cu | W | Ru | Mo |
| --- | --- | --- | --- | --- |
| DENSITY [kg/m³] | $0.892 \times 10^4$ | $1.925 \times 10^4$ | $1.237 \times 10^4$ | $1.028 \times 10^4$ |
| YOUNG'S MODULUS [GPa] | 130 | 411 | 447 | 329 |
| POISSON'S RATIO | 0.34 | 0.28 | 0.30 | 0.31 |

First, the metal film 16 was set to the Cu film and the simulation was performed.

FIGS. 2A to 3C are views illustrating results that simulated an admittance with respect to a standardized frequency in the resonator. A film thickness ratio (h/λ) which is a ratio of the film thickness h of the metal film 16 to the pitch λ (i.e., the wavelength of the SH wave) of the IDT 12 changes from 0.02 to 0.11. A horizontal axis is the standardized frequency, and a longitudinal axis is the admittance. The metal film 16 is the Cu film, and the piezoelectric substrate 10 is a rotated Y-cut X-propagation lithium tantalate substrate having a cut angle of 36°.

An admittance difference ΔY between a resonant frequency and an anti-resonant frequency of the resonator is used as a scale to evaluate a degree of the loss of the resonator. In the resonant frequency of the resonator, the larger the admittance, the smaller the loss. In the anti-resonant frequency of the resonator, the smaller the admittance, the smaller the loss. For this reason, the larger the ΔY, the larger a Q-value of the resonator, and the loss is reduced.

As illustrated in FIGS. 2A to 3C, when the h/λ is from 0.02 to 0.08, the ΔY is relatively small, and when the h/λ is from 0.09 to 0.11, the ΔY is relatively large. Thus, the resonator with the h/λ equal to or more than 0.09 has a large ΔY and is a low loss resonator, compared with the resonator with the h/λ equal to or less than 0.08. Moreover, when the h/λ is from 0.02 to 0.06, the peaks of the resonant frequency and the anti-resonant frequency are not sharp. When the h/λ is 0.08, the peak of the resonant frequency is sharp and the Q-value becomes high. Moreover, when the h/λ is from 0.09 to 0.11, the peaks of the resonant frequency and the anti-resonant frequency are sharp and the Q-value becomes high.

Figure 4:
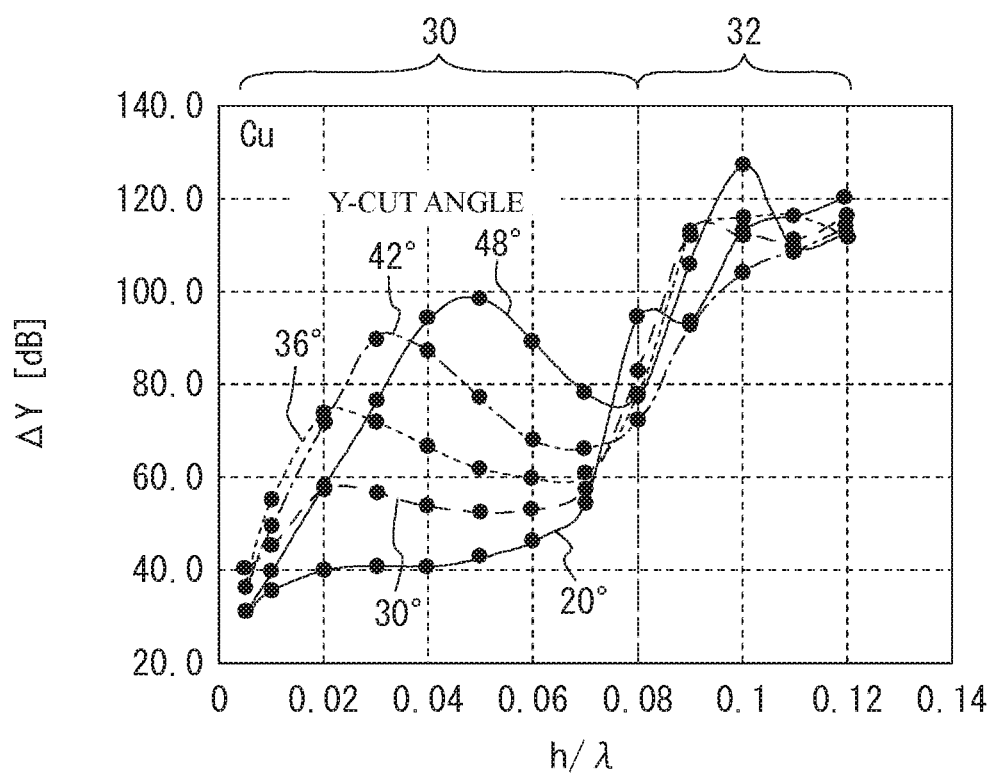
FIG. 4 is a view illustrating ΔY with respect to h/λ of the resonator using Cu as an electrode.
Figure 5A:
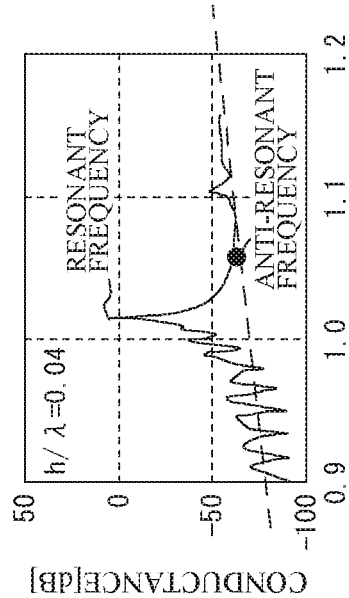
FIGS. 5A to 5D are views illustrating results that simulated a conductance with respect to a standardized frequency in the resonator.
Figure 5B:
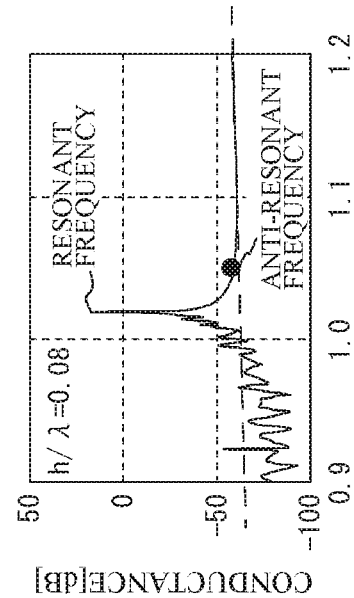
Figure 5C:
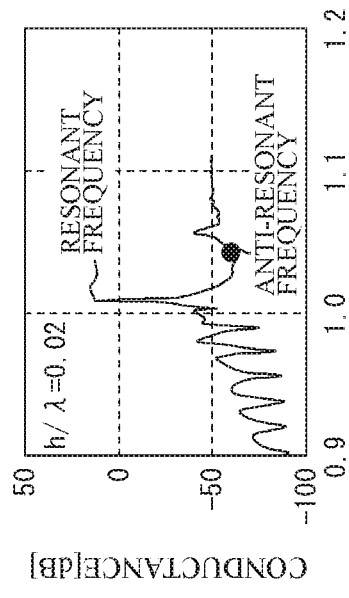
Figure 5D:
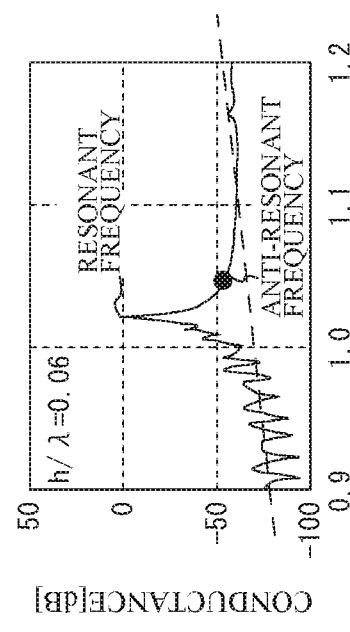
Figure 6A:
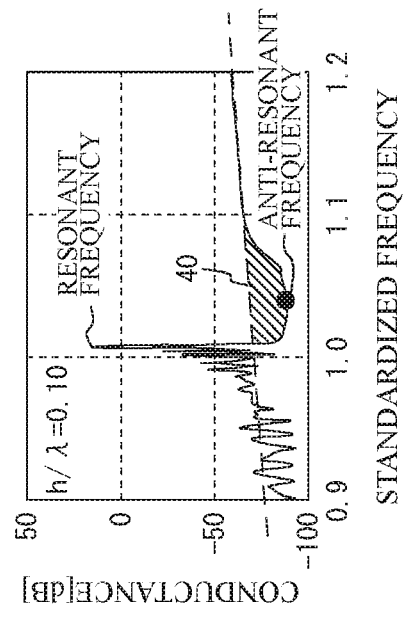
FIGS. 6A to 6C are views illustrating results that simulated a conductance with respect to a standardized frequency in the resonator.
Figure 6B:
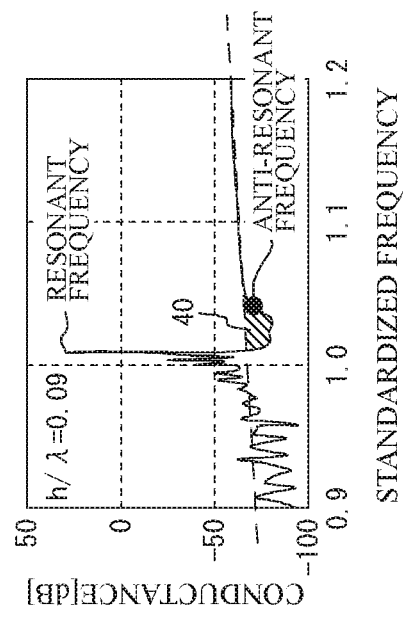
Figure 6C:
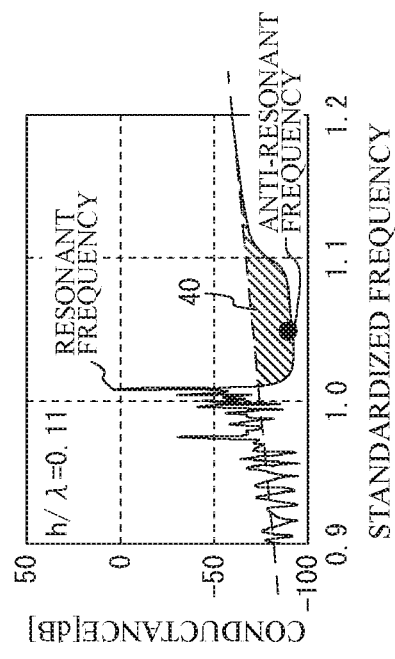

FIG. 4 is a view illustrating the ΔY with respect to the h/λ of the resonator using Cu as an electrode. A Y-cut angle of the piezoelectric substrate 10 is set to 20°, 30°, 36°, 42° and 48°. When the Y-cut angle is less than 20°, an electromechanical coupling coefficient becomes small. When the Y-cut angle is more than 48°, a temperature coefficient of the frequency increases. Therefore, a range where the Y-cut angle is from 20° to 48° is a practical range.

As illustrated in FIG. 4, a range 30 where the h/λ is equal to or less than 0.08 has local maximal values of the ΔY with respect to the h/λ. This indicates optimum film thickness of the SH wave, and this is not because the acoustic velocity of the SH wave becomes slower than that of the lateral wave of the bulk wave. In a range 32 where the h/λ is more than 0.08, the ΔY becomes large extremely.

FIGS. 5A to 6C are views illustrating results that simulated a conductance with respect to the standardized frequency in the resonator. The metal film 16 is the Cu film, and the piezoelectric substrate 10 is the rotated Y-cut X-propagation lithium tantalate substrate having the cut angle of 36°. The conductance excluding the peak of the resonant frequency is approximated by a dashed straight line. When the h/λ is from 0.09 to 0.11, a region 40 where the conductance lowers than the dashed line occurs between the resonant frequency and the anti-resonant frequency. It is considered that the region 40 is a region where the bulk wave is not emitted and the conductance lowers. As described above, the behavior of the ΔY and the conductance is changed significantly after h/λ=0.08. It is considered that, when the h/λ is more than 0.08, the acoustic velocity of the SH wave becomes slower than that of the lateral wave of the bulk wave, the emission of the bulk wave is reduced, and hence the low loss resonator is achieved.

Figure 7:
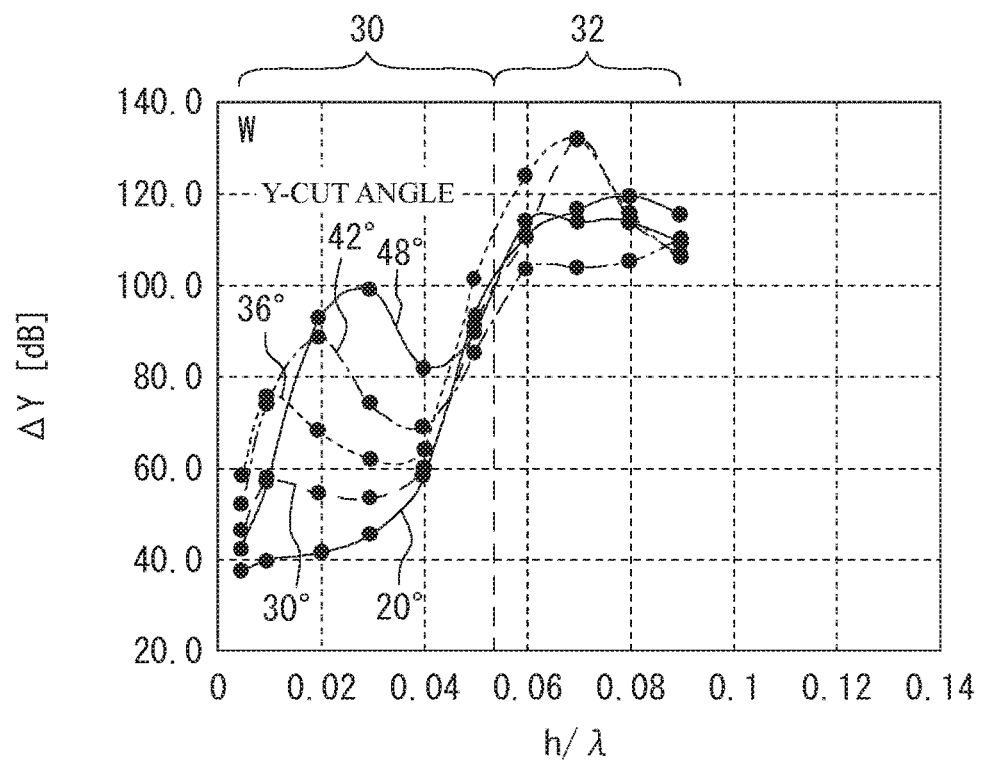
FIG. 7 is a view illustrating ΔY with respect to h/λ of the resonator using W as the electrode.

Next, the metal film 16 was set to the W film, the Ru film and the Mo film, and the simulation was performed. FIG. 7 is a view illustrating the ΔY with respect to the h/λ of the resonator using W as the electrode. As illustrated in FIG. 7, the behavior of the ΔY with respect to the h/λ is similar to the behavior in the case of Cu. The h/λ corresponding to a boundary point where the behavior of the ΔY changes is approximately 0.05.

Figure 8:
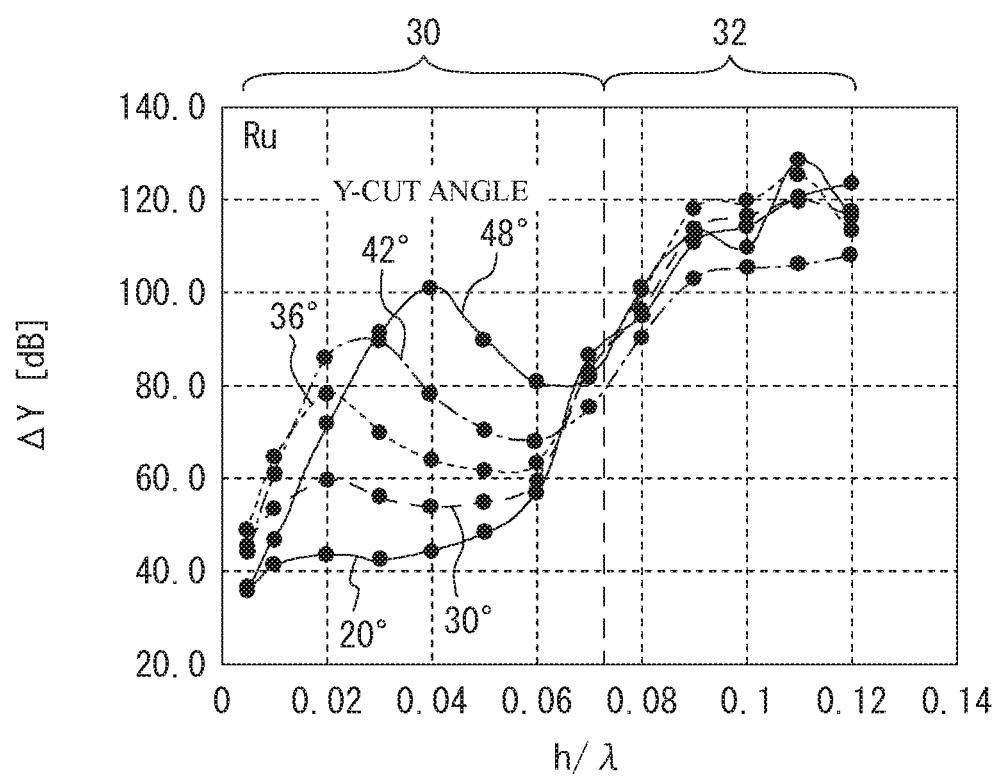
FIG. 8 is a view illustrating ΔY with respect to h/λ of the resonator using Ru as the electrode.

FIG. 8 is a view illustrating the ΔY with respect to the h/λ of the resonator using Ru as the electrode. As illustrated in FIG. 8, the behavior of the ΔY with respect to the h/λ is similar to the behavior in the case of Cu. The h/λ corresponding to a boundary point where the behavior of the ΔY changes is approximately 0.07.

Figure 9:
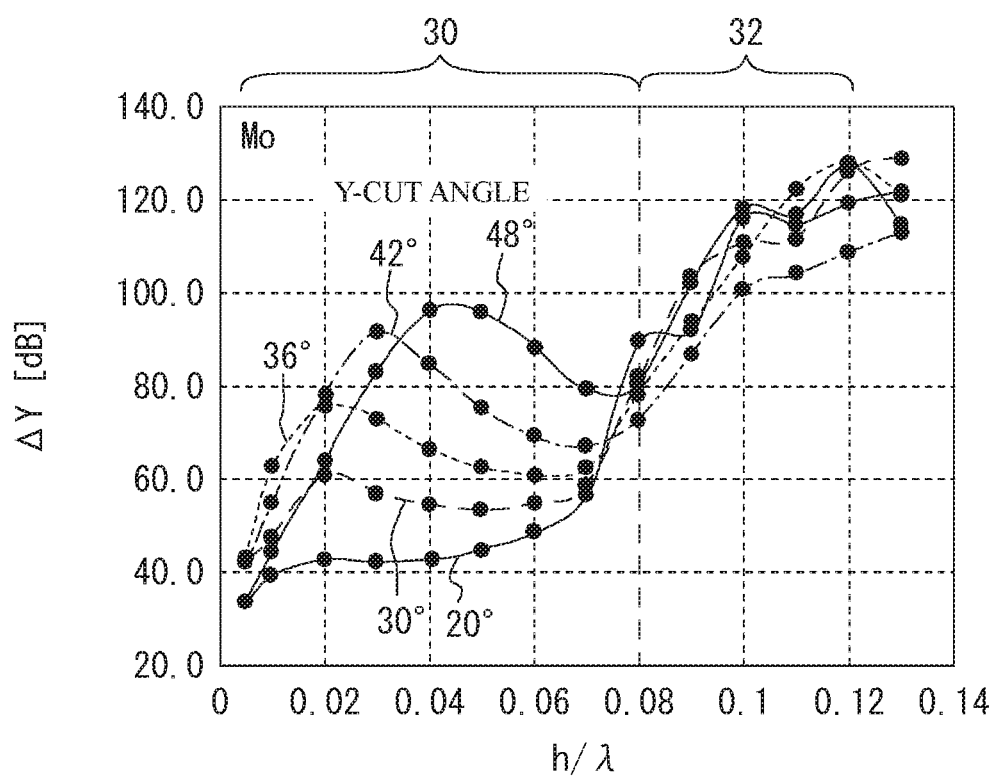
FIG. 9 is a view illustrating ΔY with respect to h/λ of the resonator using Mo as the electrode.

FIG. 9 is a view illustrating the ΔY with respect to the h/λ of the resonator using Mo as the electrode. As illustrated in FIG. 9, the behavior of the ΔY with respect to the h/λ is similar to the behavior in the case of Cu. The h/λ corresponding to a boundary point where the behavior of the ΔY changes is approximately 0.08.

With respect to W, Ru and Mo, the h/λ was standardized. The density of the metal film 16 is represented by ρ, the density of Cu is represented by ρ0, the Poisson's ratio of the metal film 16 is represented by P and the Poisson's ratio of Cu is represented by P0. At this time, the standardized h/λ is represented by "standardized h/λ=(h/λ)×(ρ/ρ0)×(P/P0)". In the case of Cu, the standardized h/λ is the same as the h/λ.

Figure 10:
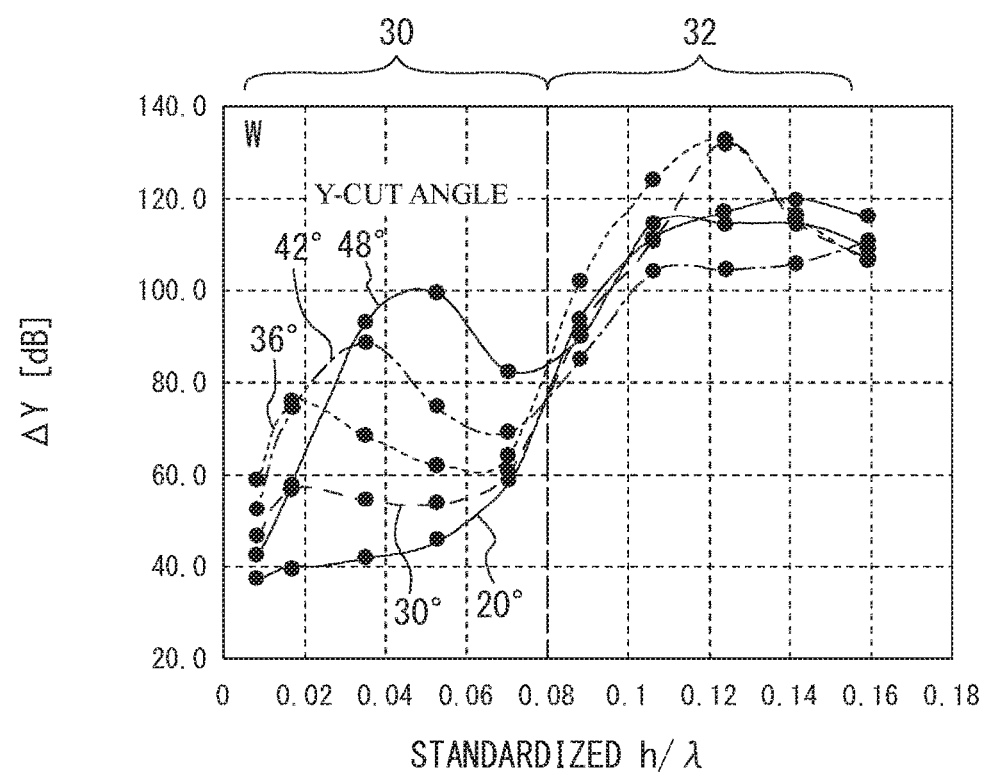
FIG. 10 is a view illustrating ΔY with respect to h/λ of the resonator using W as the electrode.
Figure 11:
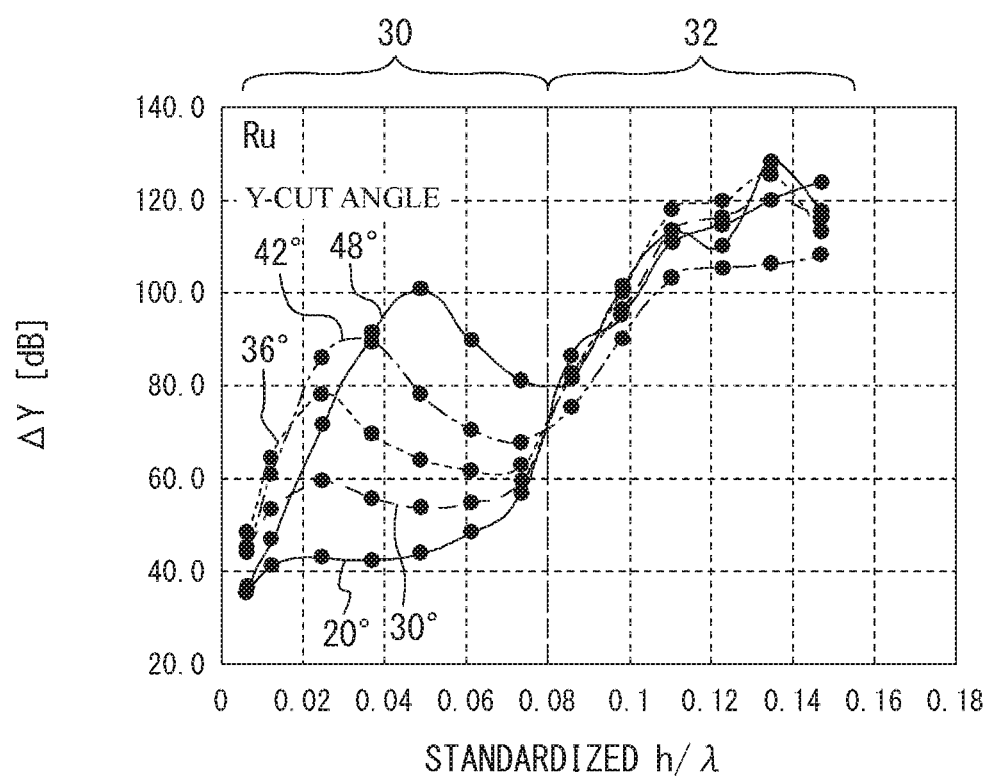
FIG. 11 is a view illustrating ΔY with respect to h/λ of the resonator using Ru as the electrode.
Figure 12:
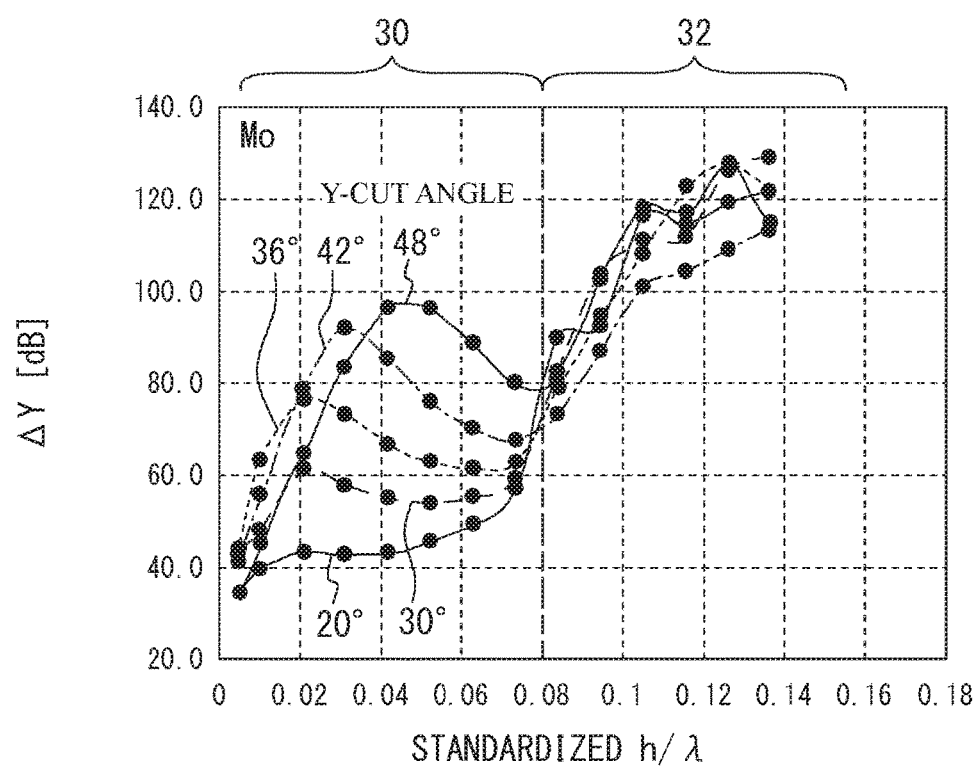
FIG. 12 is a view illustrating ΔY with respect to h/λ of the resonator using Mo as the electrode.

FIG. 10 is a view illustrating the ΔY with respect to the h/λ of the resonator using W as the electrode. FIG. 11 is a view illustrating the ΔY with respect to the h/λ of the resonator using Ru as the electrode. FIG. 12 is a view illustrating the ΔY with respect to the h/λ of the resonator using Mo as the electrode. In the range 32 where the h/λ is more than 0.08, the emission of the bulk wave can be reduced and the loss can be reduced, as illustrated in FIGS. 10 to 12. Thus, by using the standardized hλ, the boundary between the ranges 30 and 32 can be generalized regardless of a material of the metal film 16.

Figure 13A:
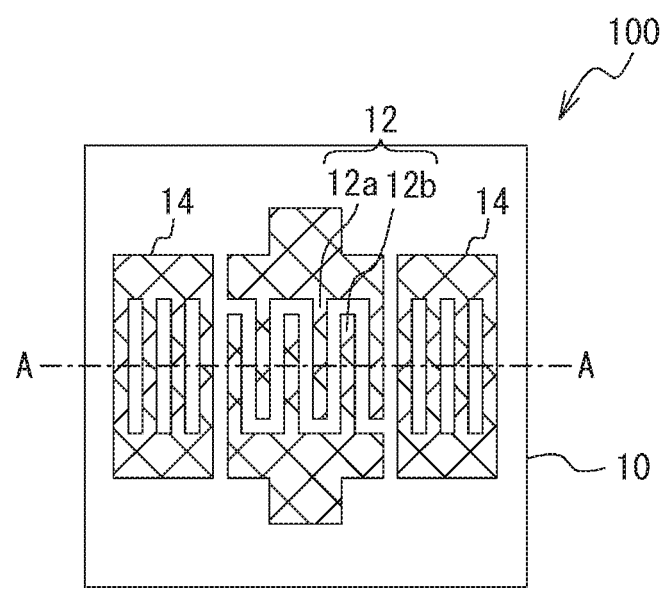
FIG. 13A is a plane view of a resonator according to a first embodiment.
Figure 13B:
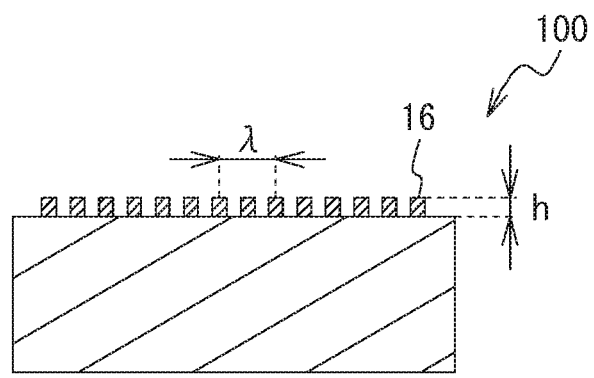
FIG. 13B is a cross-section view taken along a line A-A of FIG. 13A.

FIG. 13A is a plane view of a resonator according to a first embodiment. FIG. 13B is a cross-section view taken along a line A-A of FIG. 13A. In a resonator 100, the IDT 12 and the reflectors 14 are formed on the piezoelectric substrate 10 which is the rotated Y-cut X-propagation lithium tantalate substrate, as illustrated in FIGS. 13A and 13B. The IDT 12 and the reflectors 14 are made of the metal film 16. The Y-cut angle of the piezoelectric substrate 10 is 20° or more and 48° or less. The Y-cut angle may be 25° or more, or 30° or more, and 45° or less, or 40° or less. Each of the electrode fingers of the IDT 12 forms a grating electrode. The grating electrode is made of the metal film 16. The standardized h/λ of the metal film 16 is more than 0.08. When the Y-cut angle is set to 20° or more and 48° or less, and the standardized h/λ is set more than 0.08, a main mode of the acoustic wave that the IDT 12 excites is the SH wave.

Thereby, the emission of the bulk wave is reduced and the loss can be reduced as illustrated in FIGS. 4, 11 and 12. In order to reduce the loss, the standardized h/λ is preferably 0.09 or more, and more preferably 0.10 or more. When the standardized h/λ is more than 0.14, a Rayleigh wave having almost the same frequency as the SH wave increases. For this reason, spuriouses increase. Therefore, the standardized h/λ is preferably 0.14 or less, more preferably 0.13 or less, and further preferably 0.12 or less.

A principal component of the metal film 16 is preferably a material in which the acoustic velocity is slow, and which is heavy. Moreover, the principal component of the metal film 16 can be preferably deposited on the piezoelectric substrate 10. The principal component of the metal film 16 is preferably at least one of Cu, W, Ru, Mo, Ta (tantalum) and Pt (platinum), for example.

When the principal component of the metal film 16 is Cu as illustrated in FIG. 4, the h/λ is preferably more than 0.08, more preferably 0.09 or more, and further preferably 0.10 or more. When the principal component of the metal film 16 is W as illustrated in FIG. 7, the h/λ is preferably more than 0.05, more preferably 0.055 or more, and further preferably 0.06 or more. When the principal component of the metal film 16 is Ru as illustrated in FIG. 8, the h/λ is preferably more than 0.07, more preferably 0.08 or more, and further preferably 0.09 or more. When the principal component of the metal film 16 is Mo as illustrated in FIG. 9, the h/λ is preferably more than 0.08, more preferably 0.09 or more, and further preferably 0.10 or more. Here, the principal component is a component from which unintended impurities are excluded and from which the impurities which are intentionally added for improvement in a characteristic are excluded, and a component including 50 or more atom %.

For example, the metal film may include other elements so that the Poisson's ratio/density is within ±10% with respect to a pure metal.

The pitches between the electrode fingers in the grating electrodes (the IDT 12) and the reflectors 14 may be different from each other in the range of 10% or less, preferably 5% or less. The pitches in the grating electrodes may be varied in the range of 10% or less, preferably 5% or less. In this case, even when either pitch in the grating electrodes is used as the λ of the h/λ, an error of the h/λ is 10% or less, or 5% or less, and hardly influences a result.

Figure 14A:
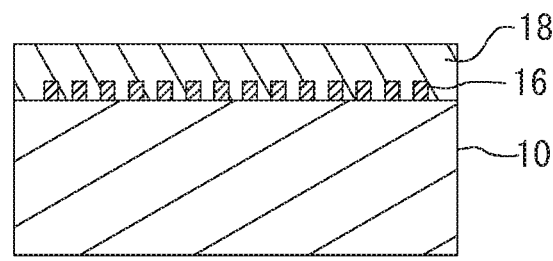
FIGS. 14A to 14C are cross-section views of resonators according to first to third variation examples of the first embodiment, respectively.
Figure 14B:
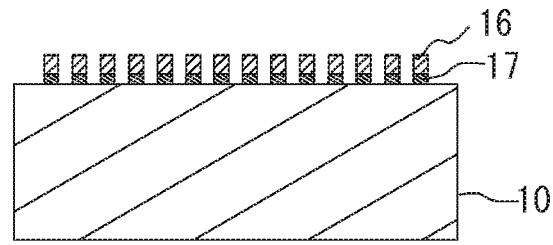
Figure 14C:
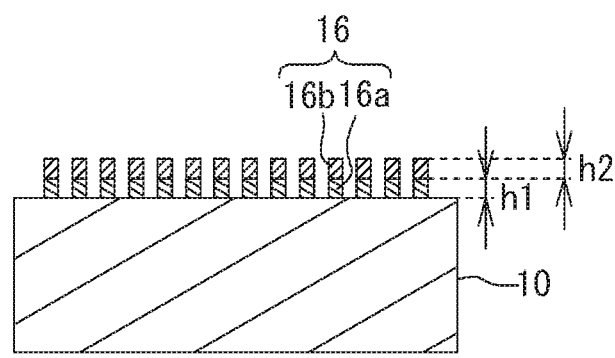

FIGS. 14A to 14C are cross-section views of resonators according to first to third variation examples of the first embodiment, respectively. As illustrated in FIG. 14A, a dielectric film 18 is formed on the piezoelectric substrate 10 so as to cover the metal film 16. The dielectric film 18 is a film for frequency adjustment and/or temperature change compensation. For example, a silicon oxide film, a silicon nitride film, and an aluminum oxide film can be used as the dielectric film 18. The dielectric film 18 is lighter than the metal film 16. Therefore, the existence or the nonexistence of the dielectric film 18 hardly influences the result of the simulation mentioned above.

As illustrated in FIG. 14B, an adhesion layer 17 may be formed between the metal film 16 and the piezoelectric substrate 10. The adhesion layer 17 improves adhesion of the metal film 16 and the piezoelectric substrate 10. For example, Ti (titanium) or Cr (chromium) can be used as the adhesion layer 17. A material of the adhesion layer 17 is lighter and thinner than the metal film 16. Therefore, the existence or the nonexistence of the adhesion layer 17 hardly influences the result of the simulation mentioned above.

As illustrated in FIG. 14C, a plurality of metal films 16a and 16b may be laminated as the metal film 16. At this time, the standardized h/λ can be a total of two standardized h/λ calculated with each of the metal films 16a and 16b. The film thickness, the density and the Poisson's ratio of the metal film 16a are represented by h1, ρ1 and P1, respectively, and the film thickness, the density and the Poisson's ratio of the metal film 16b are represented by h2, ρ2 and P2, respectively. The standardized h1/λ of the metal film 16a is represented by "standardized h1/λ=(h1/λ)×(ρ1/ρ0)×(P1/P0)". The standardized h2/λ of the metal film 16b is represented by "standardized h2/λ=(h2/λ)×(ρ2/ρ0)×(P2/P0)". Therefore, the standardized h/λ of the metal film 16 is represented by "standardized h/λ=standardized h1/λ+standardized h2/λ=(h1/λ)×(ρ1/ρ0)×(P1/P0)+(h2/λ)×(ρ2/ρ0)×(P2/P0)". The standardized h/λ calculated in this way needs to be more than 0.08.

Thus, when the plurality of metal films as the grating electrode are laminated on the piezoelectric substrate 10, and when the density of each metal film in the plurality of metal films is represented by ρi, the Poisson's ratio of each metal film is represented by Pi, the film thickness of each metal film is represented by hi, the density of Cu is represented by ρ0, the Poisson's ratio of Cu is represented by P0 and the pitch is represented by λ, a total value of "(hi/λ)×(ρi/ρ0)×(Pi/P0)" for each metal film with respect to the plurality of metal films needs to be more than 0.08.

Second Embodiment

Figure 15:
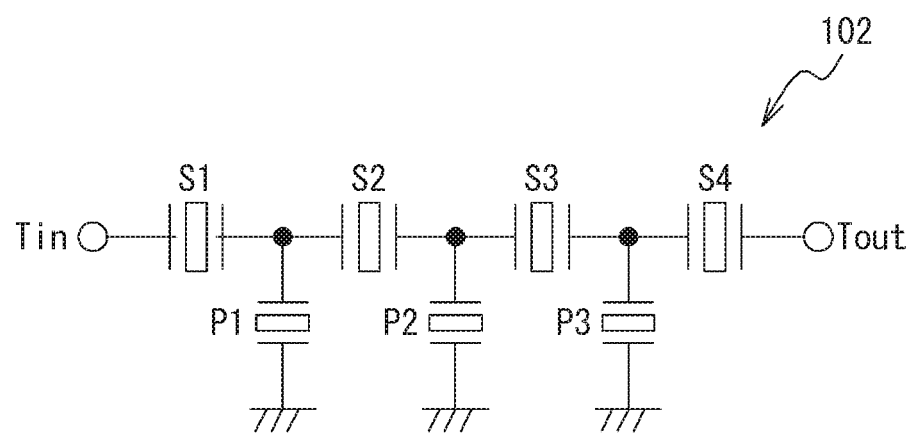
FIG. 15 is a circuit diagram illustrating a filter according to a second embodiment.

A second embodiment represents an example of a filter as the acoustic wave device. FIG. 15 is a circuit diagram illustrating the filter according to the second embodiment. As illustrated in FIG. 15, in a filter 102, one or more series resonators S1 to S4 are connected in series between an input terminal Tin and an output terminal Tout. One or more parallel resonators P1 to P3 are connected in parallel between the input terminal Tin and the output terminal Tout. At least one of the series resonators S1 to S4 and the parallel resonators P1 to P3 is the resonator according to the first embodiment or the variation examples of the first embodiment. Thus, the filter 102 includes the grating electrodes according to the first embodiment or the variation examples of the first embodiment. Thereby, the loss of the filter 102 can be reduced.

The number of series resonators and parallel resonators of the filter 102 and a connection form of the series resonators and the parallel resonators can be set appropriately. Moreover, the second embodiment explains a ladder type filter as an example, but the filter may be a multiple mode filter or the like.

Third Embodiment

Figure 16:
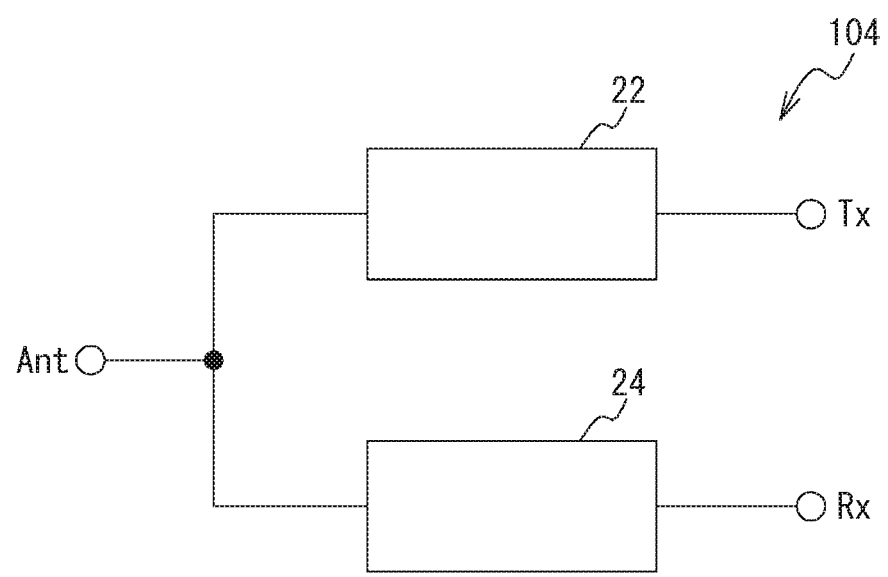
FIG. 16 is a block diagram of a duplexer according to a third embodiment.

A third embodiment represents an example of a duplexer as the acoustic wave device. FIG. 16 is a block diagram of the duplexer according to the third embodiment. As illustrated in FIG. 16, in a duplexer 104, a transmitting filter 22 is connected between a common terminal Ant and a transmission terminal Tx. A receiving filter 24 is connected between the common terminal Ant and a reception terminal Rx. The filter 102 according to the second embodiment can be used for at least one of the transmitting filter 22 and the receiving filter 24. Thus, the duplexer 104 includes the filter 102 according to the second embodiment. Thereby, the loss of the duplexer 104 can be reduced.

The third embodiment explains an example that the duplexer 104 includes the transmitting filter 22 and the receiving filter 24, but both filters may be any one of the transmitting filter or the receiving filter.

Fourth Embodiment

Figure 17A:
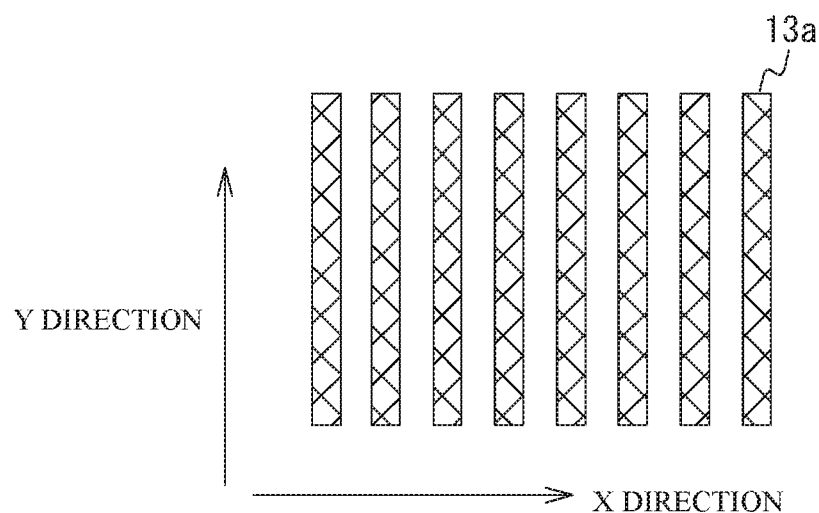
FIG. 17A is a plane view of arranged electrode fingers.
Figure 17B:
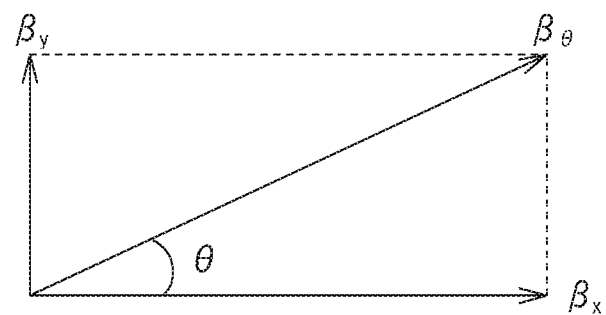
FIG. 17B is a plane view of a wave number.

A fourth embodiment represents an example that an anisotropy coefficient changes from negative to positive by thickening the grating electrodes. FIG. 17A is a plane view of arranged electrode fingers. FIG. 17B is a plane view of a wave number. An X direction and a Y direction of FIGS. 17A and 17B are directions for explaining the anisotropy coefficient, and do not necessarily correspond to an X-axis orientation and a Y-axis orientation of a crystal azimuth of the piezoelectric substrate.

As illustrated in FIG. 17A, electrode fingers 13a of the IDT 12 are arranged in the X direction on the piezoelectric substrate. A direction orthogonal to the X direction is the Y direction. The acoustic wave propagates in the X direction. An acoustic wave in the X direction has a wave number $\beta x$, and an acoustic wave in the Y direction has a wave number $\beta y$. When the wave number $\beta \theta$ of an acoustic wave in a direction inclined at an angle θ from the X direction to the Y direction can be approximated by a parabola with respect to the angle θ, the wave number $\beta \theta$ is represented by "$\beta x^2 + \gamma \cdot \beta y^2 = \beta \theta^2$" with use of an anisotropy coefficient γ.

Figure 18:
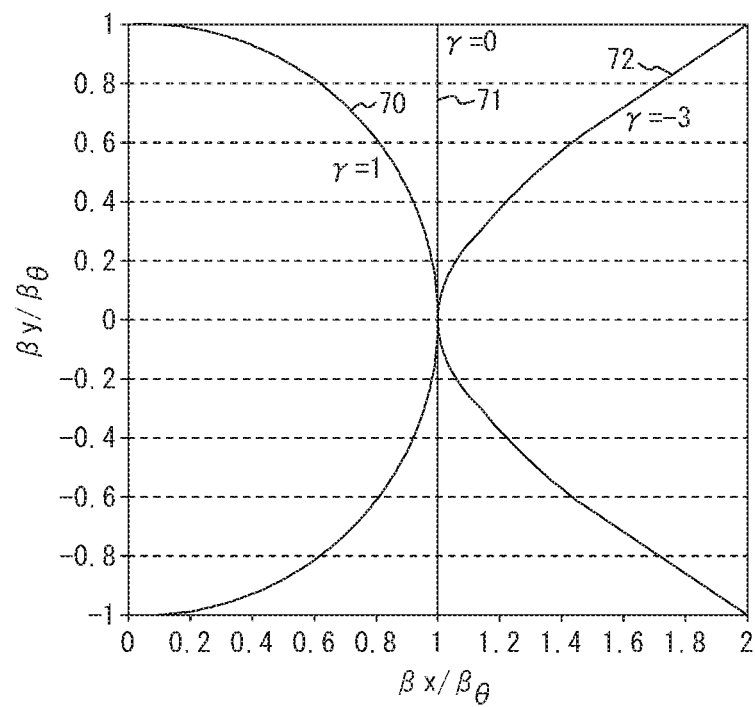
FIG. 18 is a view illustrating βy/βθ with respect to βx/βθ.

FIG. 18 is a view illustrating $\beta y/\beta \theta$ with respect to $\beta x/\beta \theta$. The $\beta x/\beta \theta$ corresponds to a slowness of a phase velocity of the acoustic wave in the X direction, and the $\beta y/\beta \theta$ corresponds to a slowness of a phase velocity of the acoustic wave in the Y direction. FIG. 18 represents the cases of the anisotropy coefficient γ=1, 0 and −3. A slowness surface 70 when the anisotropy coefficient γ is positive has a convex surface when viewed from an origin. Thus, the state of γ>0 is also referred to as a convex state. When the anisotropy coefficient γ is 0, a slowness surface 71 is a flat. A slowness surface 72 when the anisotropy coefficient γ is negative has a concave surface when viewed from the origin. Thus, the state of γ<0 is also referred to as a concave state.

When the rotated Y-cut X-propagation lithium tantalate substrate is used as the piezoelectric substrate, the anisotropy coefficient γ is negative. The material and the film thickness of the electrode fingers were changed, and the anisotropy coefficient γ was simulated.

In the simulation, the resonator having the structure of FIGS. 1A and 1B was used. The structure of the resonator used for the simulation is represented below.

Piezoelectric substrate 10: 42°-rotated Y-cut X-propagation lithium tantalate substrate Pitch λ: 4 μm Duty ratio of the electrode fingers: 50%

Number of pairs of the electrode fingers in the IDT and Opening length: infinite The physical property values of the Cu film, the W film and the Mo film used for the simulation are the same as those of the first embodiment. A table 2 represents physical property values of an Al film and a Ti film.

TABLE 2

|  | Al | Ti |
|---|---|---|
| DENSITY [kg/m$^3$] | 0.270 × 10$^4$ | 0.450 × 10$^4$ |
| YOUNG'S MODULUS [GPa] | 70 | 116 |
| POISSON'S RATIO | 0.35 | 0.34 |

Figure 19:
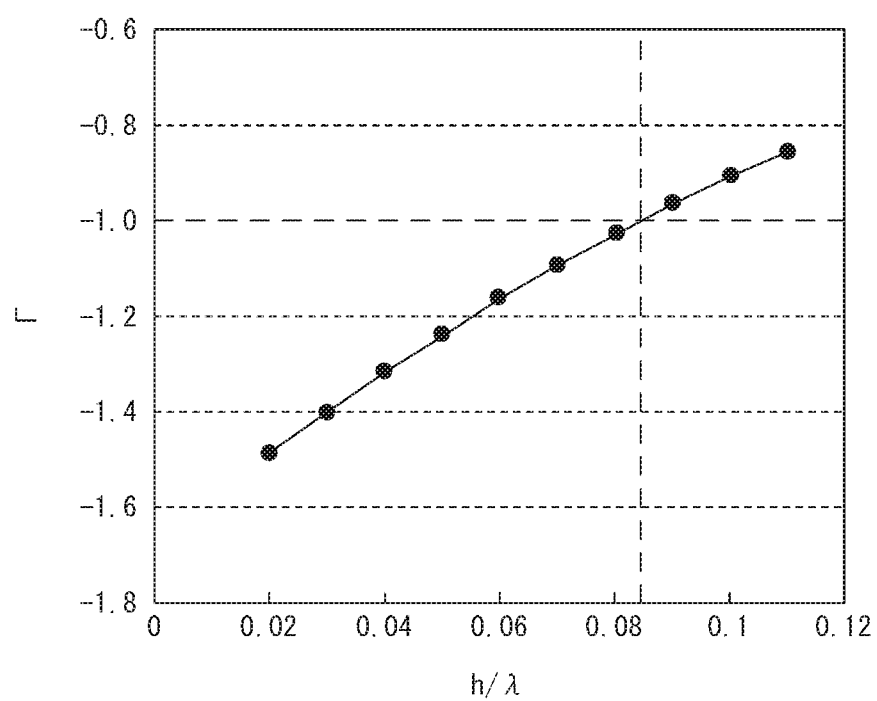
FIG. 19 is a view illustrating Γ with respect to h/λ of the resonator using Mo as a metal film.

FIG. 19 is a view illustrating a Γ with respect to the h/λ of the resonator using Mo as a metal film. The anisotropy coefficient γ is represented by "γ=1+Γ". That is, when the Γ is more than −1, the anisotropy coefficient γ is positive, and when the Γ is less than −1, the anisotropy coefficient γ is negative. When a film thickness ratio h/λ which is a ratio of the film thickness of the electrode fingers 13a (i.e., the metal film forming the electrode fingers 13a) to the wavelength of the SH wave increases, the Γ increases as illustrated in FIG. 19. When the h/λ is about 0.08 or less, the Γ is less than −1 (i.e., the anisotropy coefficient γ is negative). When the h/λ is more than about 0.08, the Γ is more than −1 (i.e., the anisotropy coefficient γ is positive). Thus, when the film thickness of the electrode fingers 13a increases, the anisotropy coefficient γ changes from negative to positive.

A table 3 represents the h/λ and the Γ when the Mo film, the Cu film, the Al film, the W film and the Ti film are used as the metal film.

TABLE 3

| Mo | | Cu | | Al | | W | | Ti | |
|---|---|---|---|---|---|---|---|---|---|
| h/λ | Γ | h/λ | Γ | h/λ | Γ | h/λ | Γ | h/λ | Γ |
| 0.08 | −1.0314 | 0.07 | −1.0592 | 0.125 | −1.1106 | 0.04 | −1.0786 | 0.10 | −1.13 |
| 0.09 | −0.8512 | 0.08 | −0.9896 | 0.15 | −0.9156 | 0.05 | −0.9154 | 0.125 | −0.9746 |

When the h/λ in the Mo film is more than about 0.08, the Γ is more than −1 as illustrated in the table 3. When the h/λ in the Cu film is about 0.08 or more, the Γ is more than −1. When the h/λ in the Al film is about 0.15 or more, the Γ is more than −1. When the h/λ in the W film is about 0.05 or more, the Γ is more than −1. When the h/λ in the Ti film is about 0.125, the Γ is more than −1.

As described above, the film thickness ratio h/λ where the anisotropy coefficient γ changes from negative to positive is almost identical with a h/λ where the behavior of the difference of the admittance changes in the first embodiment, i.e., a h/λ where the acoustic velocity of the SH wave is made slower than that of the lateral wave of the bulk wave. Thus, the anisotropy coefficient γ is positive in the range of the h/λ where the loss is reduced in the first embodiment. It is unclear why the h/λ where the anisotropy coefficient γ changes to positive is almost identical with the h/λ where the acoustic velocity of the SH wave is made slower than that of the lateral wave of the bulk wave. However, since the acoustic wave is related to the h/λ, it is considered that the h/λ can be standardized with the density and the Poisson's ratio of the metal film forming the electrode fingers 13a, as with the first embodiment.

When the anisotropy coefficient γ is positive, the undesired lateral-mode waves can be reduced easily, compared with a case where the anisotropy coefficient γ is negative. When the anisotropy coefficient γ is positive for example, the undesired lateral-mode waves can be reduced easily using the methods of the Patent Documents 3 and 4.

Figure 20A:
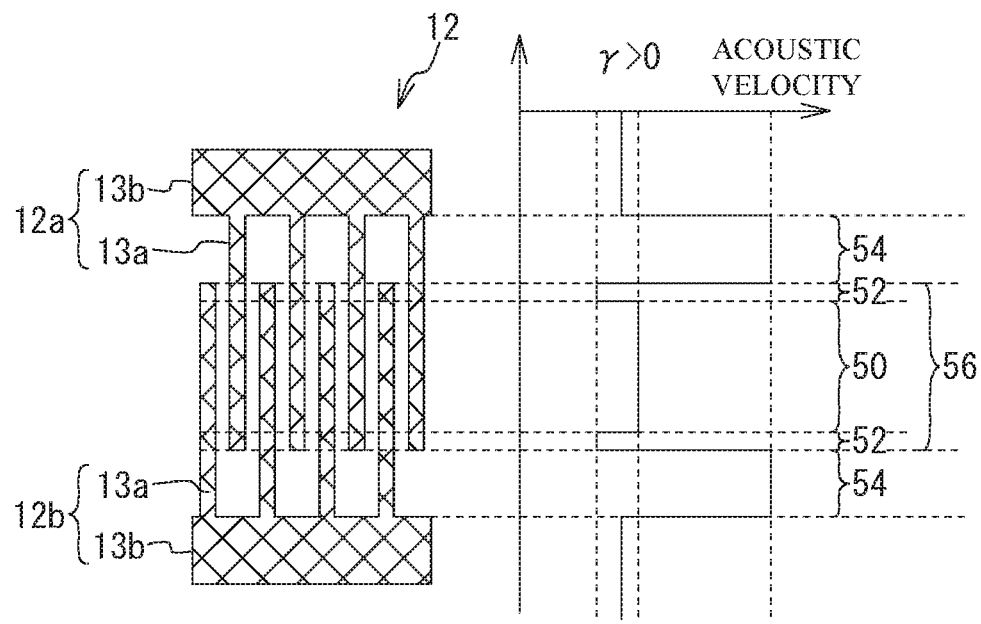
FIGS. 20A and 20B are views illustrating acoustic velocities in the IDT for reducing undesired lateral-mode waves.
Figure 20B:
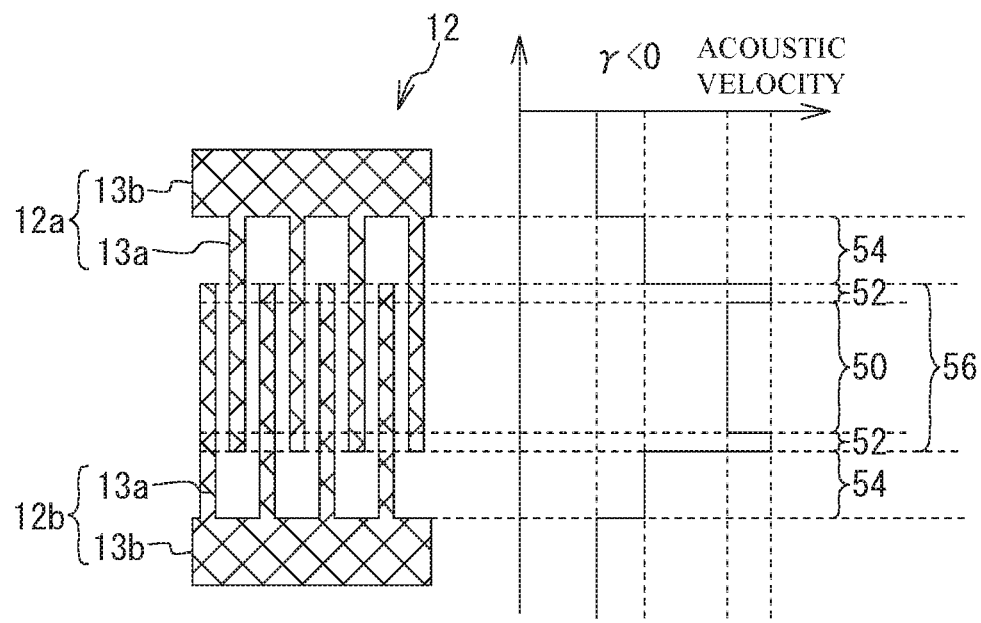

FIGS. 20A and 20B are views illustrating acoustic velocities in the IDT for reducing the undesired lateral-mode waves. FIGS. 20A and 20B correspond to a case where the anisotropy coefficient γ is positive and a case where the anisotropy coefficient γ is negative, respectively. As illustrated in left views of FIGS. 20A and 20B, the IDT 12 includes two interdigital electrodes 12a and 12b. Each of the interdigital electrodes 12a and 12b includes the electrode fingers 13a and a bus bar 13b. The electrode fingers 13a are connected to the bus bar 13b. The electrode fingers 13a correspond to the grating electrodes. A region where the electrode fingers 13a intersect is an overlap region 56 (which is also called "an opening region"). The overlap region 56 has a central region 50 and edge regions 52. There is a gap region 54 between the overlap region 56 and the bus bar 13b.

When the anisotropy coefficient γ is positive, the acoustic velocity of the gap region 54 is made faster than that of the overlap region 56 as illustrated in a right view of FIG. 20A. Thereby, the acoustic wave is confined in the overlap region 56. The acoustic velocity of the edge regions 52 is made slower than that of the central region 50. Thereby, the undesired lateral-mode waves can be reduced. When the anisotropy coefficient γ is negative, the acoustic velocity of the gap region 54 is made slower than that of the overlap region 56 as illustrated in a right view of FIG. 20B. Thereby, the acoustic wave is confined in the overlap region 56. The acoustic velocity of the edge regions 52 is made faster than that of the central region 50. Thereby, the undesired lateral-mode waves can be reduced. Such a structure is called a piston mode structure.

In order to cope with the case where the anisotropy coefficient γ is positive, and to make the acoustic velocity of the edge regions 52 slower than that of the central region 50, a width of the electrode fingers 13a in the edge regions 52 is made wider than that of the electrode fingers 13a in the central region 50, as described in the Patent Document 3. On the other hand, in order to cope with the case where the anisotropy coefficient γ is negative, and to make the acoustic velocity of the edge regions 52 faster than that of the central region 50, the width of the electrode fingers 13a in the edge regions 52 is made narrower than that of the electrode fingers 13a in the central region 50. Forming the width of the electrode fingers 13a narrowly has a large load from a viewpoint of production. Therefore, when the anisotropy coefficient γ is positive, the undesired lateral-mode waves can be easily reduced compared with the case where the anisotropy coefficient γ is negative. Moreover, as described in the Patent Document 4, a method of forming an additional film on the electrode fingers 13a in the edge regions 52 can be used as a method for making the acoustic velocity of the edge regions 52 slower than that of the central region 50.

The anisotropy coefficient γ of the rotated Y-cut X-propagation lithium tantalate substrate is negative as illustrated in FIG. 20B, but the film thickness of the electrode is made greater. Thereby, the anisotropy coefficient γ becomes positive as illustrated in FIG. 20A. Therefore, the undesired lateral-mode waves can be easily reduced.

According to the fourth embodiment, the piezoelectric substrate 10 is a Y-cut X-propagation lithium tantalate substrate having a cut angle of ≥20° and ≤48°. When the plurality of metal films as the grating electrode are laminated on the piezoelectric substrate 10 as with the first embodiment, and the density of each metal film in the plurality of metal films is represented by ρi, the Poisson's ratio of each metal film is represented by Pi, the film thickness of each metal film is represented by hi, the density of Cu is represented by ρ0, the Poisson's ratio of Cu is represented by P0 and the pitch is represented by λ, a total value of "(hi/λ)× (ρi/ρ0)×(Pi/P0)" for each metal film with respect to the plurality of metal films is made more than 0.08. Thereby, the anisotropy coefficient in the piezoelectric substrate 10 is negative, but the anisotropy coefficient as the acoustic wave device can be made positive.

Then, the overlap region 56 on which the grating electrodes (i.e., the electrode fingers 13a) are provided includes: the central region 50 provided in the center of the grating electrodes in an extending direction of the grating electrodes; and the edge regions 52 provided on the edges of the grating electrodes in an extending direction of the grating electrodes. The acoustic velocity of the acoustic wave in the edge regions 52 is made faster than the acoustic velocity of the acoustic wave in the central region 50. Thereby, the undesired lateral-mode waves can be easily reduced.

Figure 21A:
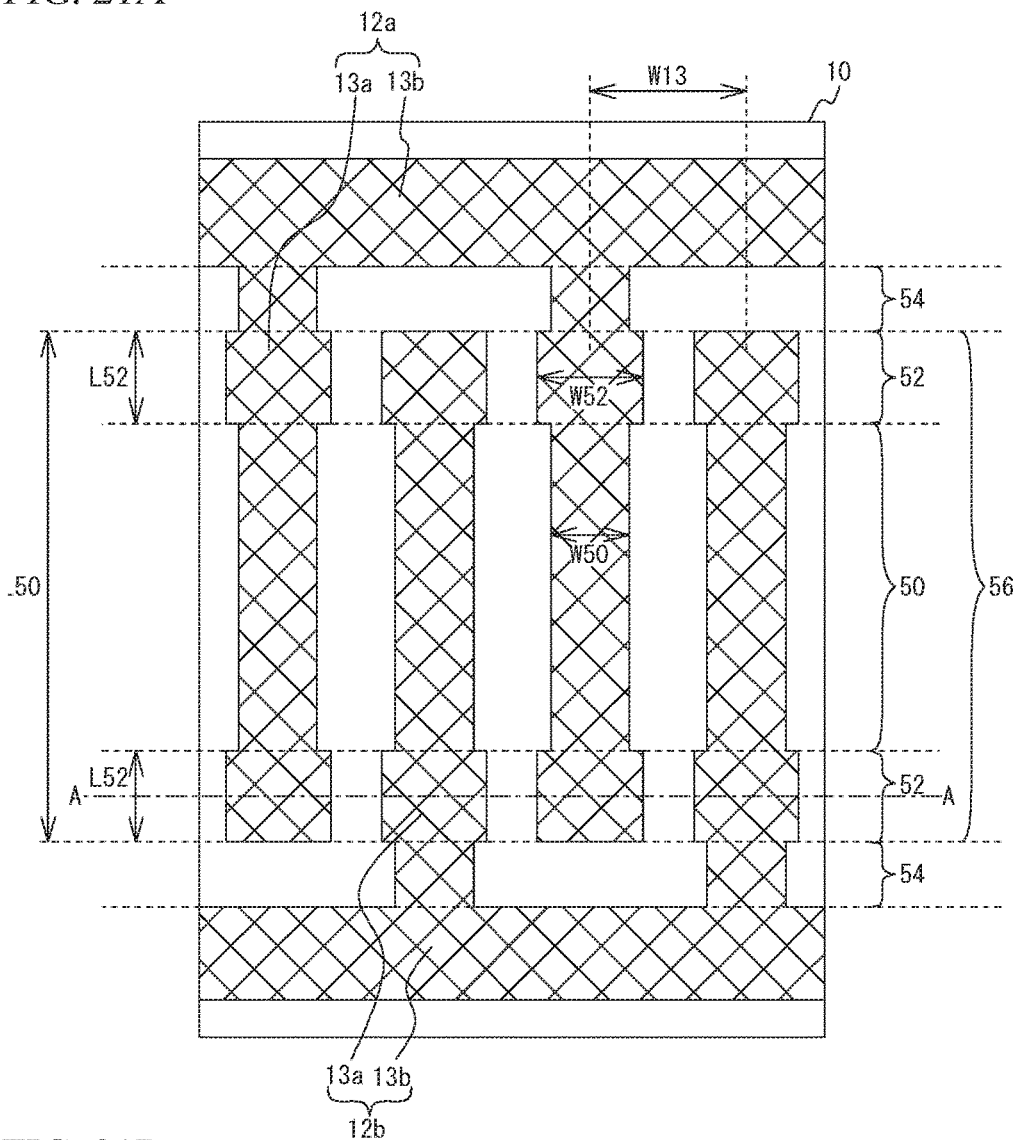
FIG. 21A is a plane view of a part of an acoustic wave device according to a first variation example of a fourth embodiment.
Figure 21B:
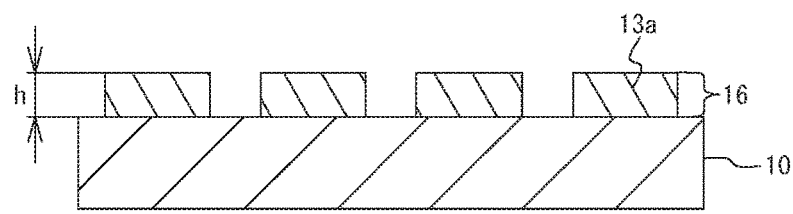
FIG. 21B is a cross-section view taken along a line A-A of FIG. 21A.

A description will be given of a method for reducing the undesired lateral-mode waves. FIG. 21A is a plane view of a part of an acoustic wave device according to a first variation example of the fourth embodiment. FIG. 21B is a cross-section view taken along a line A-A of FIG. 21A. The IDT 12 is formed as illustrated in FIGS. 21A and 21B. A width W52 of each of the electrode fingers 13a in the edge regions 52 is wider than a width W50 of each of the electrode fingers 13a in the central region 50. The pitches W13 of the edge regions 52 and the central region 50 are the same as each other. Therefore, a duty ratio (W52/W13) of the edge regions 52 is greater than a duty ratio (W50/W13) of the central region 50.

The resonator according to the first variation example of the fourth embodiment was experimentally produced actually. The experimentally produced structure is as follows.
Pitch λ W13: 3.84 μm
Duty ratio of central region 50: 45%
Duty ratio of edge regions 52: 50%
Length L50 (Opening length) of overlap region 56: 20λ
Length L52 of edge regions 52: 1.5λ
Number of pairs of the electrode finger in the IDT: 100 pairs
Material of electrode: Cu
Film thickness ratio h/λ of electrode: 0.1λ

A resonator according to a comparative example in which the duty ratio of the edge regions 52 was 45% was also experimentally produced.

Figure 22A:
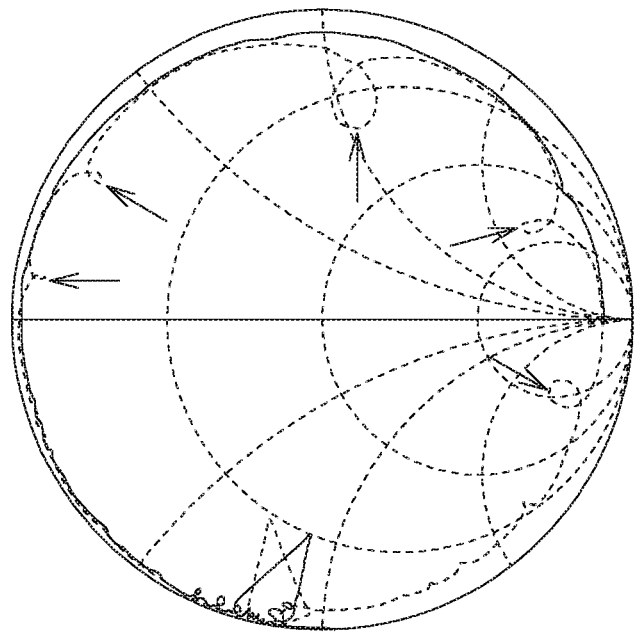
FIG. 22A is a Smith chart illustrating reflection characteristics in the resonators according to the first variation example of the fourth embodiment and a comparative example, respectively.
Figure 22B:
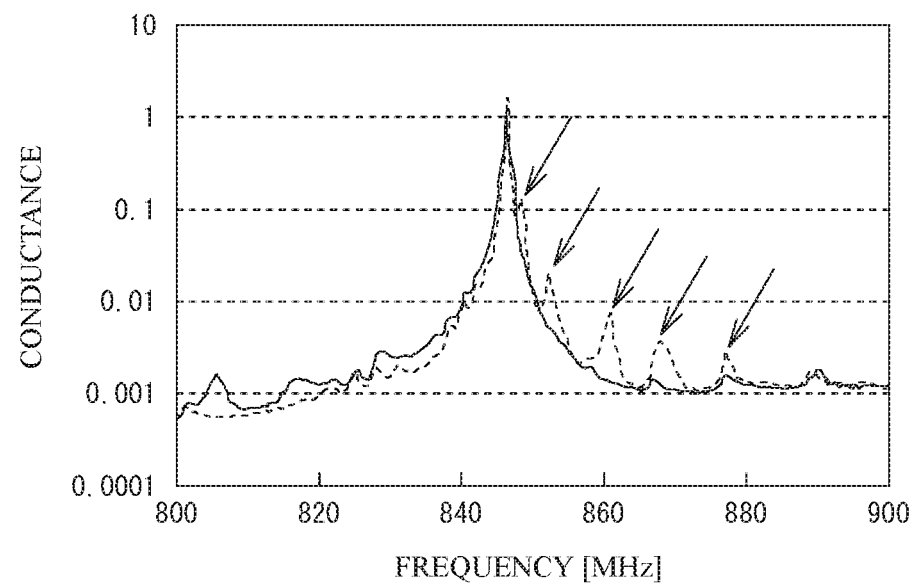
FIG. 22B is a view illustrating conductances with respect to frequencies in the resonators according to the first variation example of the fourth embodiment and a comparative example, respectively.

FIG. 22A is a Smith chart illustrating reflection characteristics in the resonators according to the first variation example of the fourth embodiment and the comparative example, respectively. FIG. 22B is a view illustrating conductances with respect to frequencies in the resonators according to the first variation example of the fourth embodiment and the comparative example, respectively. In the comparative example, spuriouses as illustrated in arrows are generated, as illustrated in FIGS. 22A and 22B. In the first variation example of the fourth embodiment, the spuriouses are reduced. It is considered that this is because the duty ratio of the edge regions 52 is greater than that of the central region 50 and hence the acoustic velocity of the acoustic wave in the edge regions 52 becomes slower than that of the acoustic wave in the central region 50.

Thus, according to the first variation example of the fourth embodiment, when the grating electrodes are Cu, the film thickness ratio h/λ of the grating electrodes is set to 0.08 or more. The width W52 of the grating electrode of the edge regions 52 in a propagation direction of the acoustic wave is made wider than the width W50 of the grating electrode of the central region 50 in a propagation direction of the acoustic wave. Thereby, the undesired lateral-mode waves can be reduced.

When the film thickness ratio h/λ of the electrode fingers 13a is small and the anisotropy coefficient γ is negative, the width W52 of each of the electrode fingers 13a in the edge regions 52 needs to be made narrower than the width W50 of each of the electrode fingers 13a in the central region 50 in order to achieve the piston mode structure. However, it is difficult to narrow the width of each of the electrode fingers 13a from the viewpoint of production. In the first variation example of the fourth embodiment, the h/λ is made larger, and the anisotropy coefficient γ is positive. Thereby, the piston mode structure can be achieved by widening the width W52 of each of the electrode fingers 13a in the edge regions 52. Therefore, the undesired lateral-mode waves can be reduced more easily.

Figure 23A:
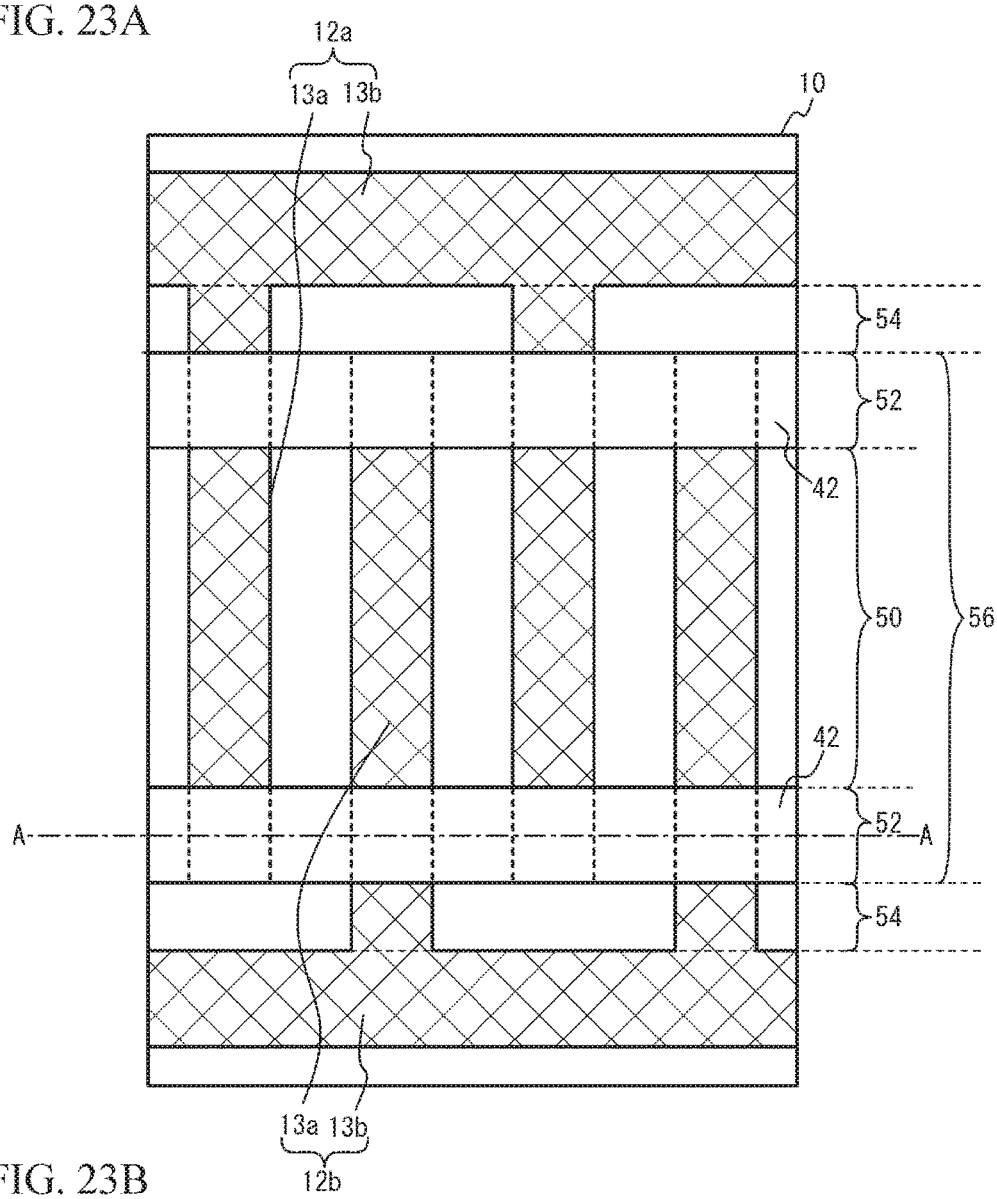
FIG. 23A is a plane view of a part of an acoustic wave device according to a second variation example of the fourth embodiment.
Figure 23B:
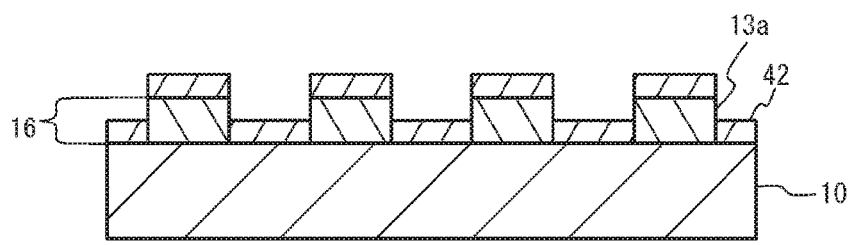
FIG. 23B is a cross-section view taken along a line A-A of FIG. 23A.

FIG. 23A is a plane view of a part of an acoustic wave device according to a second variation example of the fourth embodiment. FIG. 23B is a cross-section view taken along a line A-A of FIG. 23A. In the edge regions 52, additional films 42 are formed on the piezoelectric substrate 10 and the electrode fingers 13a, as illustrated in FIGS. 23A and 23B. Each of the additional films 42 is serially formed in a belt-like shape in the propagation direction of the acoustic wave.

According to the second variation example of the fourth embodiment, the additional films 42 are formed on the grating electrodes in the edge regions 52, and the additional films 42 are not formed on the grating electrodes in the central region 50. Thereby, the acoustic velocity of the edge regions 52 can be made slower than that of the central region 50. For example, a tantalum pentoxide ($Ta_2O_5$) film or an aluminum oxide ($Al_2O_3$) film can be used as the additional films 42. The density of the additional films 42 is preferably equal to or more than 4 g/cm$^3$, for example. Moreover, the film thickness of the additional films 42 is preferably equal to or less than 200 nm, for example.

The additional films 42 may be formed on at least a part of the electrode fingers 13a in the edge regions 52. The additional films 42 do not need to be formed on the piezoelectric substrate 10 between the electrode fingers 13a. Each of the additional films 42 to be formed on the electrode fingers 13a can be an insulating film or a metal film. Each of the additional films 42 to be formed on the piezoelectric substrate 10 between the electrode fingers 13a is preferably the insulating film.

When the anisotropy coefficient γ is negative, the piston mode structure cannot be achieved by adding the additional films 42. In the second variation example of the fourth embodiment, the h/λ is made larger, and the anisotropy coefficient γ is positive. Thereby, the piston mode structure can be easily achieved by forming the additional films 42 on the electrode fingers 13a in the edge regions 52.

Figure 24A:
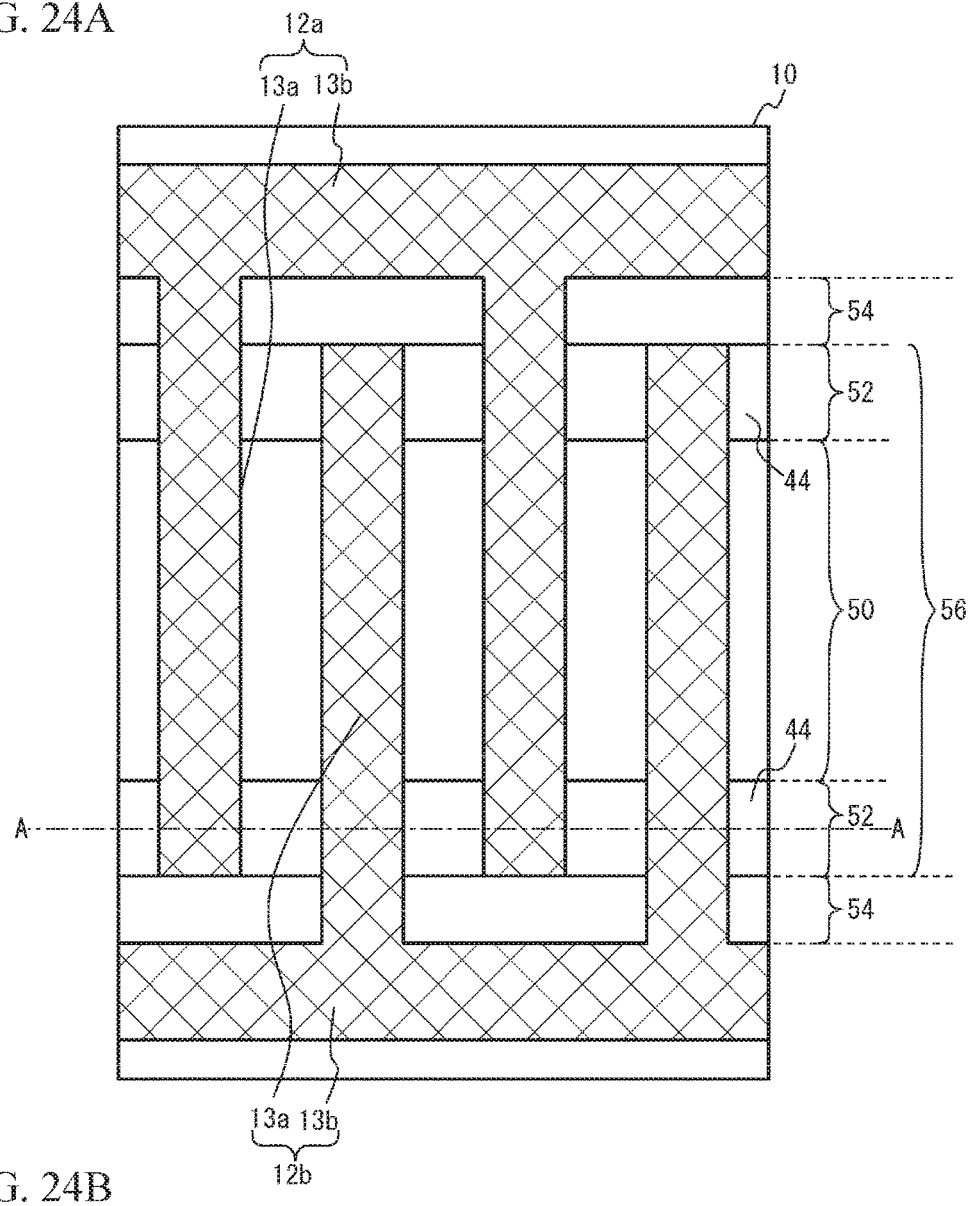
FIG. 24A is a plane view of a part of an acoustic wave device according to a third variation example of the fourth embodiment.
Figure 24B:
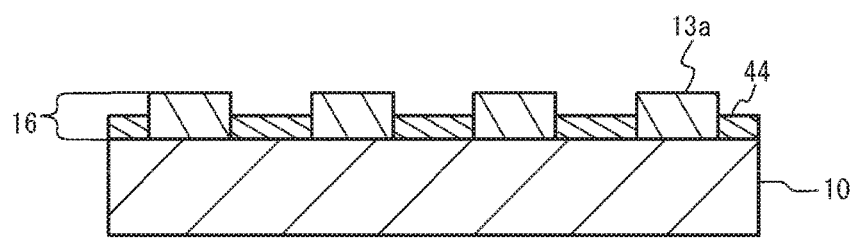
FIG. 24B is a cross-section view taken along a line A-A of FIG. 24A.

FIG. 24A is a plane view of a part of an acoustic wave device according to a third variation example of the fourth embodiment. FIG. 24B is a cross-section view taken along a line A-A of FIG. 24A. In the edge regions 52, additional films 44 are formed on the piezoelectric substrate 10 between the electrode fingers 13a, as illustrated in FIGS. 24A and 24B. The additional films 44 are not formed on the electrode fingers 13a.

According to the variation example of the fourth embodiment, the additional films 44 are formed on the piezoelectric substrate 10 between the grating electrodes in the edge regions 52, and the additional films 44 are not formed on the piezoelectric substrate 10 between the grating electrodes in the central region 50. Thereby, the acoustic velocity of the edge regions 52 can be made slower than that of the central region 50. For example, the tantalum pentoxide film or the aluminum oxide film can be used as the additional films 44. The density of the additional films 44 is preferably equal to or more than 4 g/cm$^3$, for example. Moreover, the film thickness of the additional films 44 is preferably equal to or less than 200 nm, for example.

The additional films 44 may be formed on at least a part of regions between the electrode fingers 13a in the edge regions 52. Each of the additional films 44 is preferably the insulating film.

When the anisotropy coefficient γ is negative, the piston mode structure cannot be achieved by adding the additional films 44. In the third variation example of the fourth embodiment, the h/λ is made larger, and the anisotropy coefficient γ is positive. Thereby, the piston mode structure can be easily achieved by forming the additional films 44 on the piezoelectric substrate 10 between the electrode fingers 13a in the edge regions 52.

In the fourth embodiment and the variation examples thereof, the metal film 16 may be composed of the plurality of films like the variation examples of the first embodiment. Since the central region 50 mainly contributes to the characteristic of the acoustic wave device, the length of the central region 50 is preferably more than that of the edge regions 52. The length of the central region 50 is preferably more than twice the length of the edge regions 52, and more preferably more than 10 times the length of the edge regions 52. The acoustic wave device according to the fourth embodiment and the variation examples thereof may be used for the filter of the second embodiment and the duplexer of the third embodiment.

In the first to fourth embodiments and the variation examples thereof, the surface acoustic wave device is explained as an example of the acoustic wave device, but the acoustic wave device may be a love wave device, an acoustic boundary wave device, or the like. Moreover, the piezoelectric substrate 10 may be a piezoelectric substrate joined to a support substrate such as a sapphire substrate.

Although the embodiments of the present invention have been described in detail, the present invention is not limited to these specific embodiments, and the various changes, substitutions, and alterations could be made hereto without departing from the spirit and scope of the invention.

What is claimed is:

1. An acoustic wave device comprising:
    a Y-cut X-propagation lithium tantalate substrate having a cut angle of 20° or more and 48° or less;
    a pair of interdigital electrodes that is provided on the substrate, each of the pair of interdigital electrodes includes a plurality of electrode fingers and a bus bar to which the plurality of electrode fingers are connected; and
    a grating electrode that is formed from the plurality of electrode fingers of the pair of interdigital electrodes and is composed of one or more metal films laminated on the substrate, and excites an acoustic wave, wherein when a density of each metal film in the one or more metal films is represented by ρi, a Poisson's ratio of each metal film is represented by Pi, a film thickness of each metal film is represented by hi, a density of Cu is represented by ρ0, a Poisson's ratio of Cu is represented by P0 and a pitch is represented by λ, a total value of "(hi/λ)×(ρi/ρ0)×(Pi/P0)" for each metal film with respect to the one or more metal films is more than 0.08,
    wherein
    an overlap region in which the plurality of electrode fingers of one of the pair of interdigital electrodes and the plurality of electrode fingers of another of the pair of interdigital electrodes intersect includes a central region provided in the center of the overlap region in an extending direction of the plurality of electrode fingers, and an edge region provided on an edge of the overlap region in the extending direction of the plurality of electrode fingers,
    an acoustic velocity of the acoustic wave in the edge region is slower than that of the acoustic wave in the central region, and
    an acoustic velocity of a gap region provided between the edge region and the bus bar and outside the overlap region is faster than that of the acoustic wave in the central region.

2. The acoustic wave device as claimed in claim 1, wherein
    the one or more metal films includes a metal film composed primarily of at least one of Cu, W, Ru, Mo, Ta and Pt.

3. The acoustic wave device as claimed in claim 1, wherein
    the total value is 0.09 or more.

4. The acoustic wave device as claimed in claim 1, wherein
    the acoustic wave is a SH (Shear Horizontal) wave.

5. The acoustic wave device as claimed in claim 1, further comprising:
    a dielectric film that is formed on the substrate and covers the grating electrode.

6. The acoustic wave device as claimed in claim 1, wherein
    a width of each of the plurality of electrode fingers in the edge region in a propagation direction of the acoustic wave is wider than that of each of the plurality of electrode fingers in the central region and the gap region in the propagation direction of the acoustic wave.

7. The acoustic wave device as claimed in claim 1, further comprising:
a filter including the grating electrode.

8. The acoustic wave device as claimed in claim 7, further comprising:
a duplexer including the filter.

9. An acoustic wave device comprising:
a Y-cut X-propagation lithium tantalate substrate having a cut angle of 20° or more and 48° or less;
a pair of interdigital electrodes that is provided on the substrate, each of the pair of interdigital electrodes includes a plurality of electrode fingers and a bus bar to which the plurality of electrode fingers are connected; and
a grating electrode that is formed from the plurality of electrode fingers of the pair of interdigital electrodes, excites an acoustic wave, and is composed primarily of Cu or Mo, wherein when a film thickness of the grating electrode is represented by h, and a pitch between grating electrodes is represented by $\lambda$, a h/$\lambda$ a is more than 0.08,
wherein
an overlap region in which the plurality of electrode fingers of one of the pair of interdigital electrodes and the plurality of electrode fingers of another of the pair of interdigital electrodes intersect includes a central region provided in the center of the overlap region in an extending direction of the plurality of electrode fingers, and an edge region provided on an edge of the overlap region in the extending direction of the plurality of electrode fingers,
an acoustic velocity of the acoustic wave in the edge region is slower than that of the acoustic wave in the central region, and
an acoustic velocity of a gap region provided between the edge region and the bus bar and outside the overlap region is faster than that of the acoustic wave in the central region.

10. An acoustic wave device comprising:
a Y-cut X-propagation lithium tantalate substrate having a cut angle of 20° or more and 48° or less;
a pair of interdigital electrodes that is provided on the substrate, each of the pair of interdigital electrodes includes a plurality of electrode fingers and a bus bar to which the plurality of electrode fingers are connected; and
a grating electrode that is formed from the plurality of electrode fingers of the pair of interdigital electrodes, excites an acoustic wave, and is composed primarily of W, wherein when a film thickness of the grating electrode is represented by h, and a pitch between grating electrodes is represented by $\lambda$, a h/$\lambda$ is more than 0.05,
wherein
an overlap region in which the plurality of electrode fingers of one of the pair of interdigital electrodes and the plurality of electrode fingers of another of the pair of interdigital electrodes intersect includes a central region provided in the center of the overlap region in an extending direction of the plurality of electrode fingers, and an edge region provided on an edge of the overlap region in the extending direction of the plurality of electrode fingers,
an acoustic velocity of the acoustic wave in the edge region is slower than that of the acoustic wave in the central region, and
an acoustic velocity of a gap region provided between the edge region and the bus bar and outside the overlap region is faster than that of the acoustic wave in the central region.

11. An acoustic wave device comprising:
a Y-cut X-propagation lithium tantalate substrate having a cut angle of 20° or more and 48° or less; and
a grating electrode that is formed on the substrate, excites an acoustic wave, and is composed primarily of Ru, wherein when a film thickness of the grating electrode is represented by h, and a pitch between grating electrodes is represented by $\lambda$, a h/$\lambda$ is more than 0.07.

12. An acoustic wave device, comprising:
a Y-cut X-propagation lithium tantalate substrate having a cut angle of 20° or more and 48° or less;
a pair of interdigital electrodes that is provided on the substrate, each of the pair of interdigital electrodes includes a plurality of electrode fingers and a bus bar to which the plurality of electrode fingers are connected; and
a grating electrode that is formed from the plurality of electrode fingers of the pair of interdigital electrodes and is composed of one or more metal films laminated on the substrate, and excites an acoustic wave, wherein when a density of each metal film in the one or more metal films is represented by $\rho i$, a Poisson's ratio of each metal film is represented by Pi, a film thickness of each metal film is represented by hi, a density of Cu is represented by $\rho 0$, a Poisson's ratio of Cu is represented by P0 and a pitch is represented by $\lambda$, a total value of "(hi/$\lambda$)×($\rho$i/$\rho$0)×(Pi/P0)" for each metal film with respect to the one or more metal films is more than 0.08,
wherein
an overlap region in which the plurality of electrode fingers of one of the pair of interdigital electrodes and the plurality of electrode fingers of another of the pair of interdigital electrodes intersect includes a central region provided in the center of the overlap region in an extending direction of the plurality of electrode fingers, and an edge region provided on an edge of the overlap region in the extending direction of the plurality of electrode fingers, and
an additional film is formed on the grating electrode in the edge region, and no additional film is formed on the plurality of electrode fingers in the central region and in a gap region provided between the edge region and the bus bar and outside the overlap region.

13. An acoustic wave device, comprising:
a Y-cut X-propagation lithium tantalate substrate having a cut angle of 20° or more and 48° or less; and
a grating electrode that is composed of one or more metal films laminated on the substrate, and excites an acoustic wave, wherein when a density of each metal film in the one or more metal films is represented by $\rho i$, a Poisson's ratio of each metal film is represented by Pi, a film thickness of each metal film is represented by hi, a density of Cu is represented by $\rho 0$, a Poisson's ratio of Cu is represented by P0 and a pitch is represented by $\lambda$, a total value of "(hi/$\lambda$)×($\rho$i/$\rho$0)×(Pi/P0)" for each metal film with respect to the one or more metal films is more than 0.08, wherein
a region on which the grating electrode is provided includes a central region provided in the center of the grating electrode in an extending direction of the grating electrode, and an edge region provided on an edge of the grating electrode in the extending direction of the grating electrode, and
an additional film is formed on the substrate between grating electrodes in the edge region, and no additional film is formed on the substrate between grating electrodes in the central region.

* * * * *